(12) United States Patent
Tseng et al.

(10) Patent No.: US 12,051,467 B2
(45) Date of Patent: Jul. 30, 2024

(54) PROGRAMMING OF MEMORY CELLS USING A MEMORY STRING DEPENDENT PROGRAM VOLTAGE

(71) Applicant: SanDisk Technologies LLC, Addison, TX (US)

(72) Inventors: Huai-Yuan Tseng, San Ramon, CA (US); Henry Chin, Fremont, CA (US); Deepanshu Dutta, Fremont, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 16/892,753

(22) Filed: Jun. 4, 2020

(65) Prior Publication Data

US 2021/0383870 A1    Dec. 9, 2021

(51) Int. Cl.
| | | |
|---|---|---|
| *G11C 16/10* | (2006.01) | |
| *G11C 16/04* | (2006.01) | |
| *G11C 16/08* | (2006.01) | |
| *G11C 16/24* | (2006.01) | |
| *G11C 16/26* | (2006.01) | |
| *H10B 41/10* | (2023.01) | |
| *H10B 41/27* | (2023.01) | |
| *H10B 43/10* | (2023.01) | |
| *H10B 43/27* | (2023.01) | |

(52) U.S. Cl.
CPC .......... *G11C 16/10* (2013.01); *G11C 16/0483* (2013.01); *G11C 16/08* (2013.01); *G11C 16/24* (2013.01); *G11C 16/26* (2013.01); *H10B 41/10* (2023.02); *H10B 41/27* (2023.02); *H10B 43/10* (2023.02); *H10B 43/27* (2023.02)

(58) Field of Classification Search
CPC ......... G11C 16/10; G11C 16/08; G11C 16/24; G11C 16/26; G11C 16/0483
See application file for complete search history.

(56) References Cited

U.S. PATENT DOCUMENTS

| | | | |
|---|---|---|---|
| 9,293,205 B2 * | 3/2016 | Lee .................... | G11C 16/3459 |
| 2010/0321995 A1 * | 12/2010 | Sarin ................... | G11C 11/5642 |
| | | | 365/185.2 |
| 2013/0223151 A1 * | 8/2013 | D'Abreu ................ | G11C 16/10 |
| | | | 365/185.18 |
| 2015/0078086 A1 * | 3/2015 | Lee ........................ | G11C 16/08 |
| | | | 365/185.11 |
| 2015/0154109 A1 * | 6/2015 | Fiterman ............. | G06F 12/0895 |
| | | | 711/103 |
| 2015/0221380 A1 * | 8/2015 | Lee ........................ | G11C 16/14 |
| | | | 365/185.11 |
| 2017/0125117 A1 * | 5/2017 | Tseng ..................... | G11C 16/10 |
| 2017/0133099 A1 * | 5/2017 | Hsu ..................... | G11C 16/3427 |
| 2018/0012667 A1 * | 1/2018 | Costa ................. | G11C 16/0483 |
| 2018/0190363 A1 * | 7/2018 | Lee ..................... | G11C 16/0483 |
| 2021/0005275 A1 * | 1/2021 | Hwang ................ | G11C 29/006 |

* cited by examiner

*Primary Examiner* — Sung Il Cho
(74) *Attorney, Agent, or Firm* — Dickinson Wright PLLC

(57) ABSTRACT

A storage device including control circuitry, communicatively coupled to a non-volatile memory, configured to perform a programming operation to program a set of memory cells. The control circuitry, when performing the programming operation, may be configured to apply a set of biased program voltages to lines connecting to respective memory cells in an array. The set of biased program voltages may have values that are based on positions of the respective memory cells within the array relative to an outer memory string group of a set of memory string groups.

8 Claims, 21 Drawing Sheets

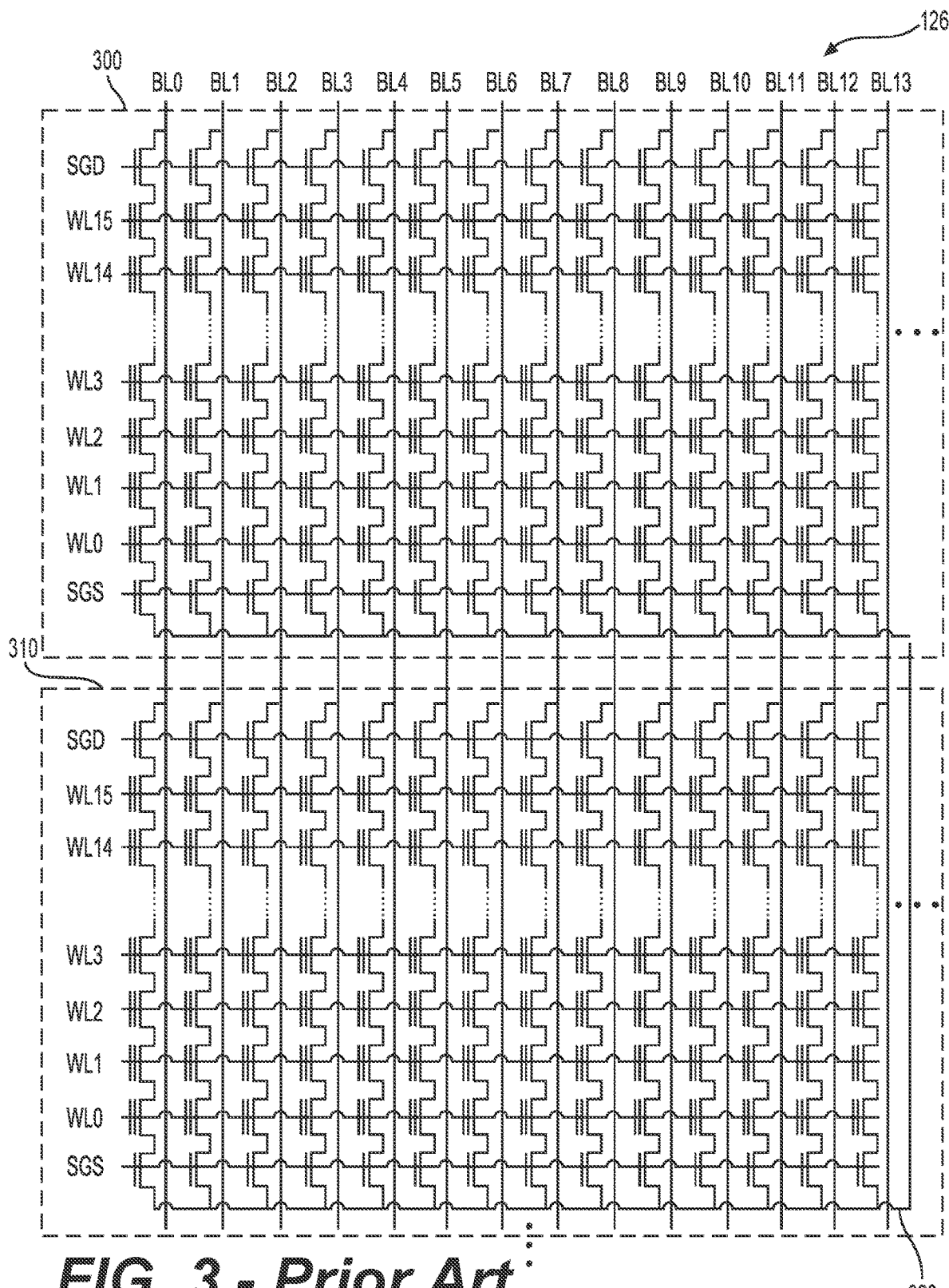
*FIG. 3 - Prior Art*

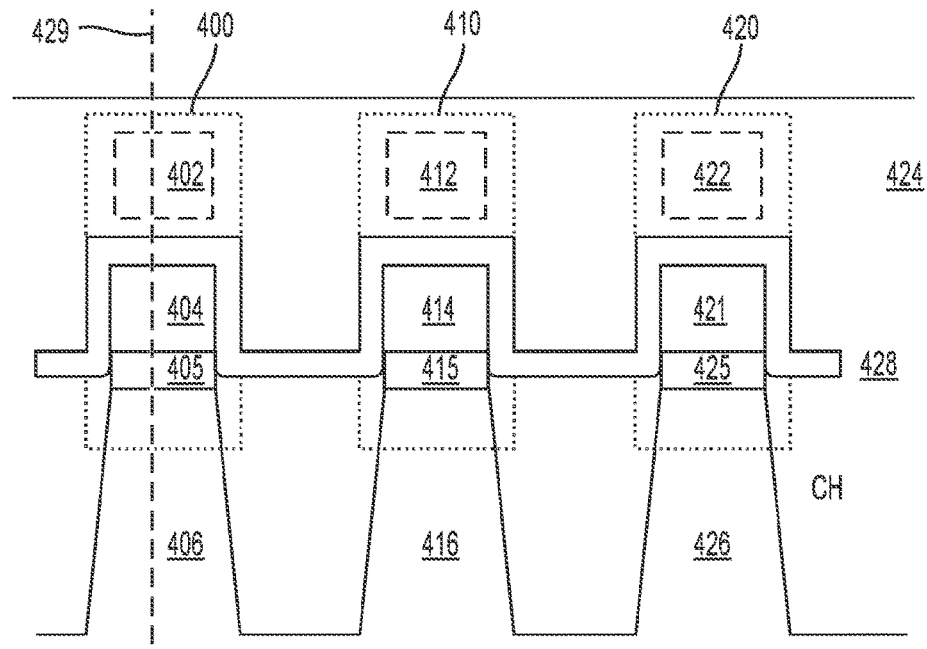
*FIG. 4A - Prior Art*
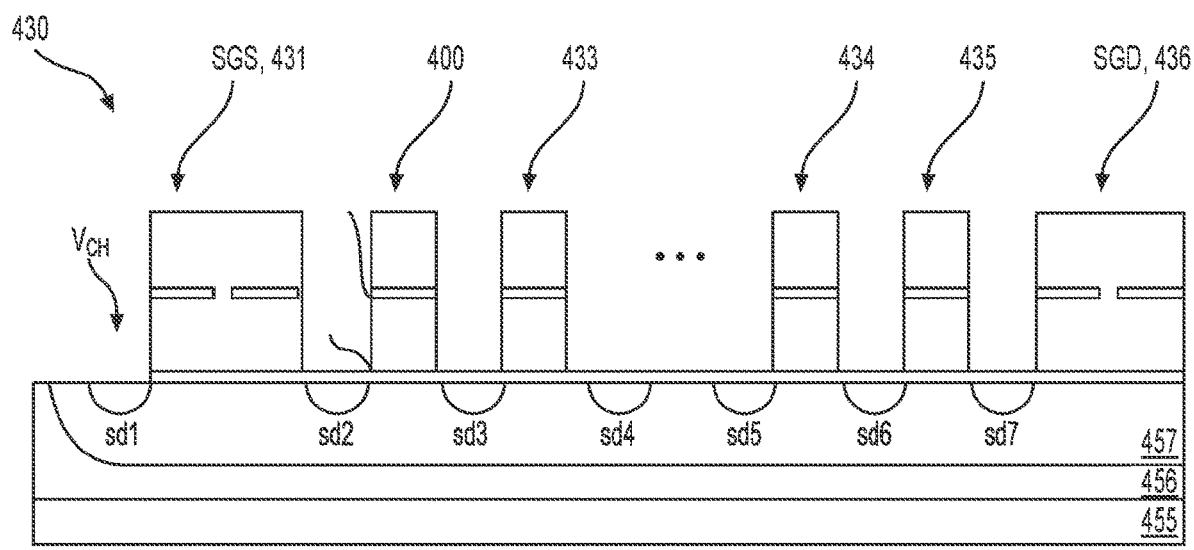
*FIG. 4B - Prior Art*

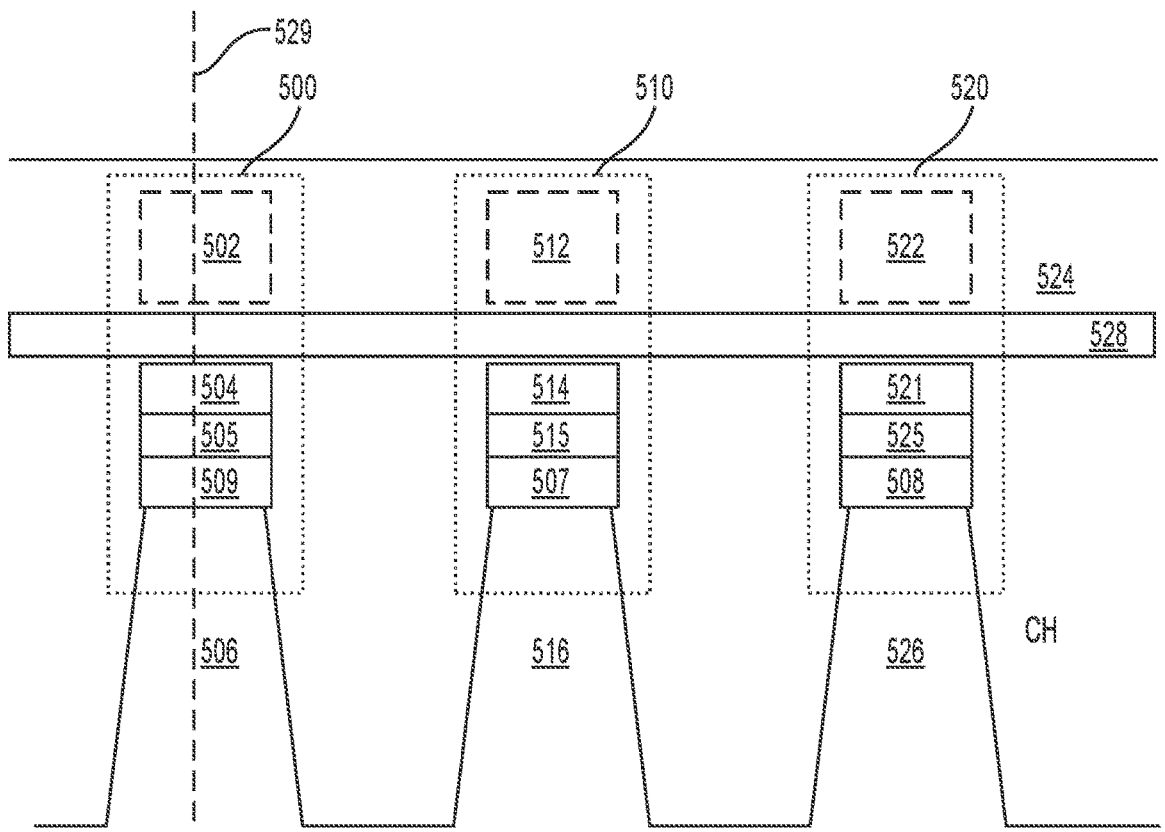
FIG. 5A - Prior Art
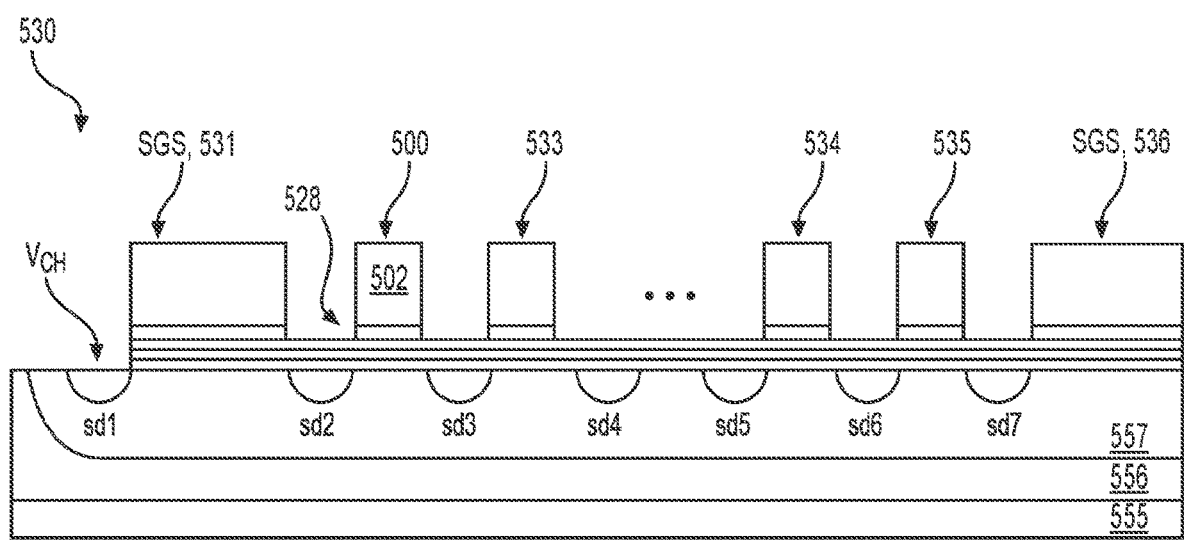
FIG. 5B - Prior Art

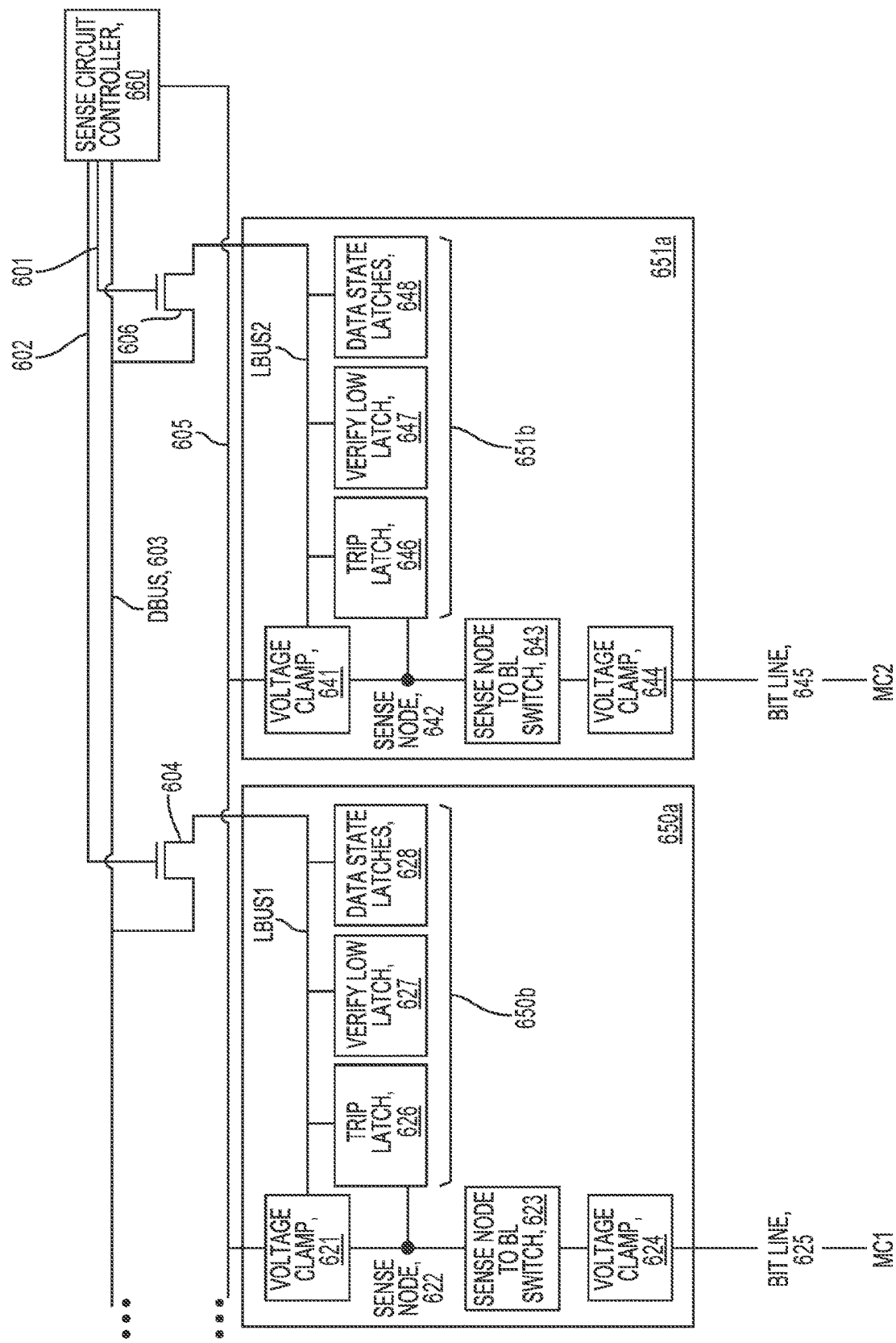
*FIG. 6B - Prior Art*

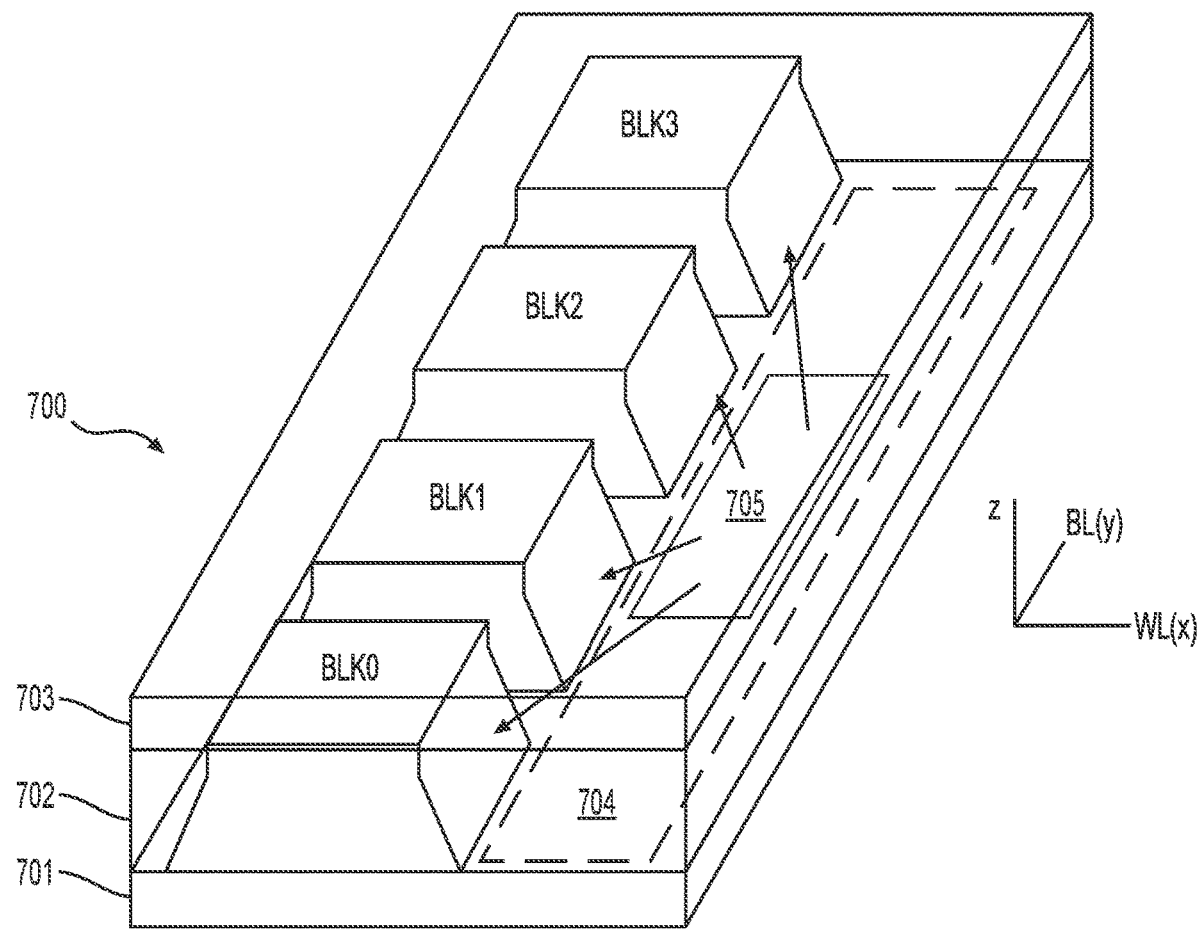
FIG. 7A - Prior Art

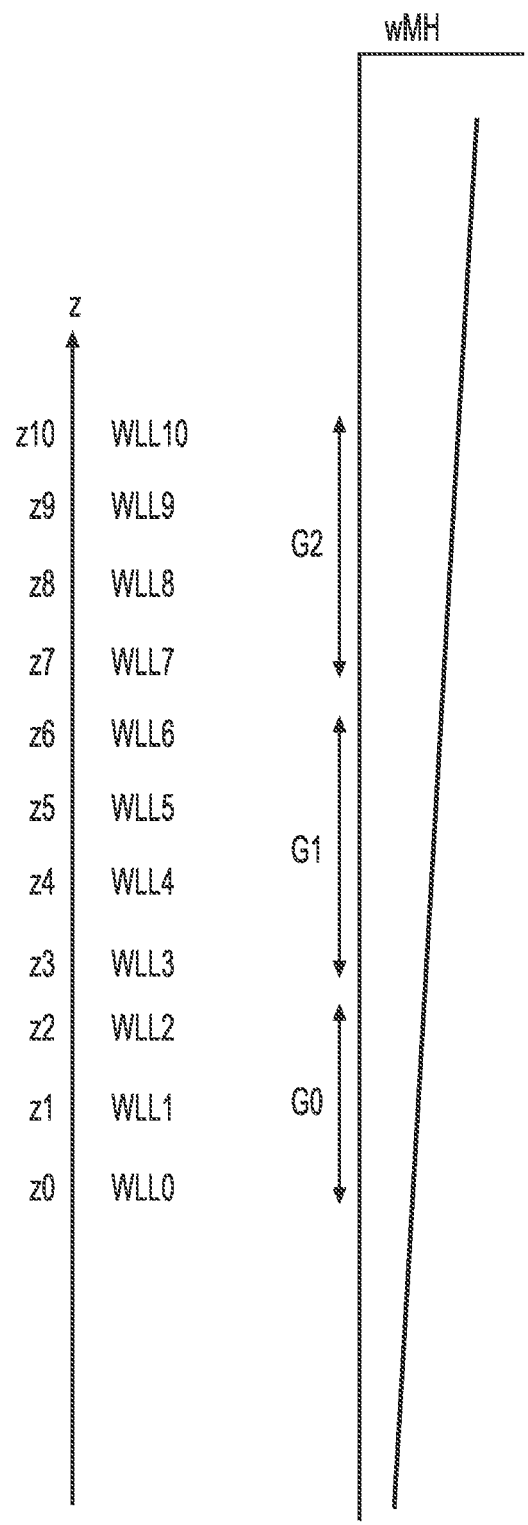
FIG. 7C - Prior Art

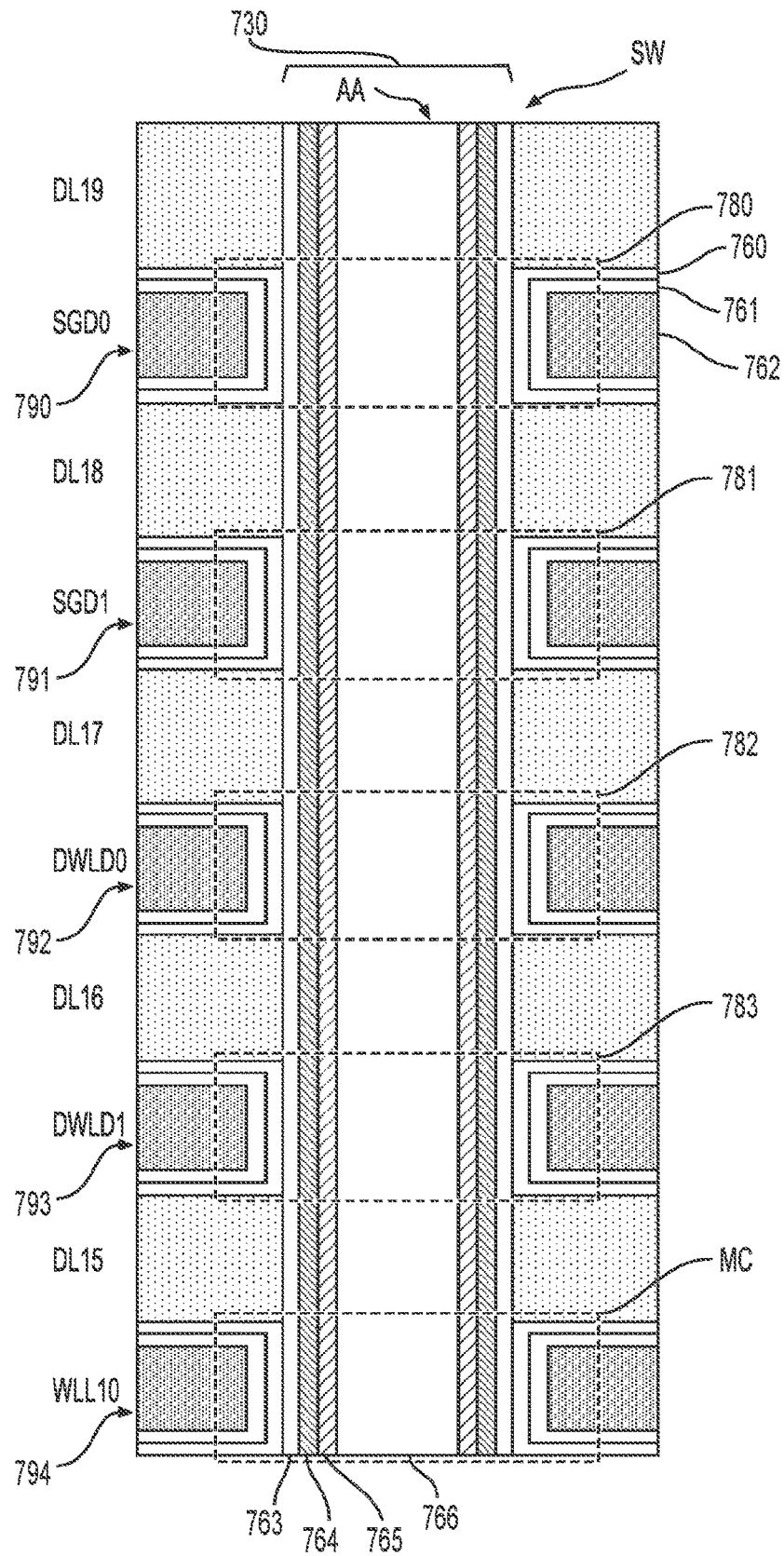
FIG. 7D - Prior Art

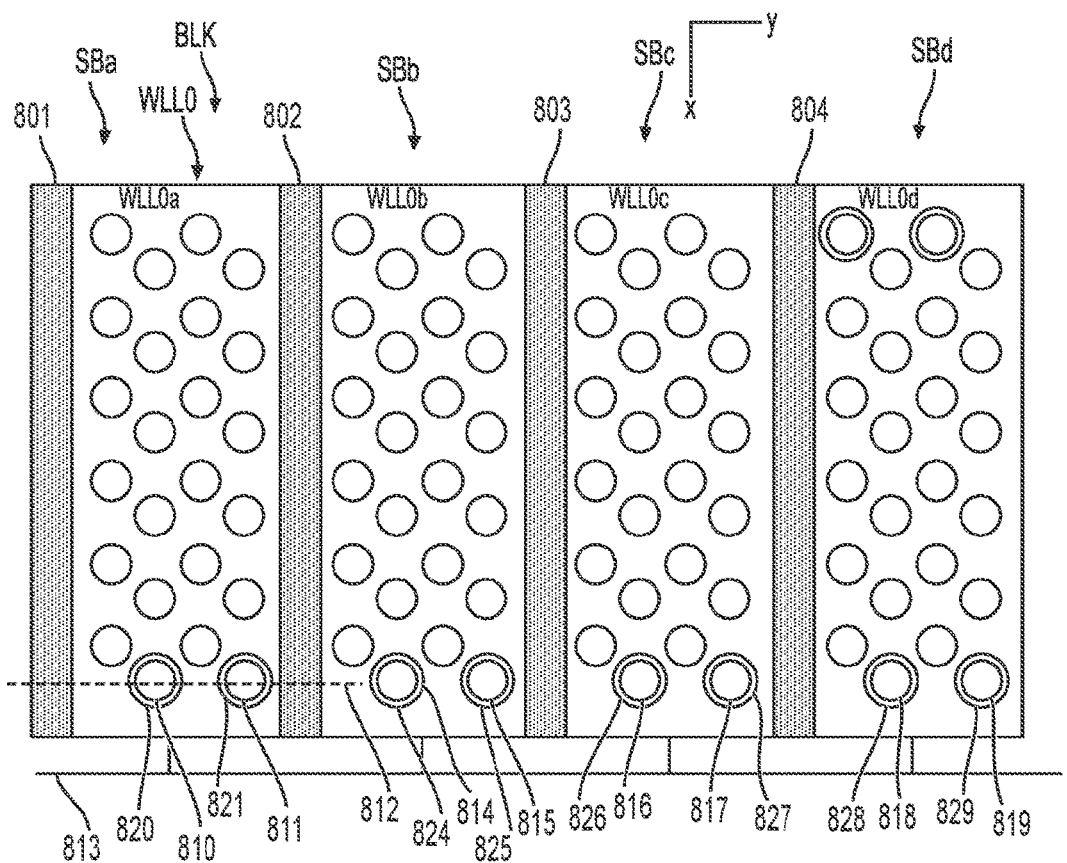
FIG. 8A - Prior Art
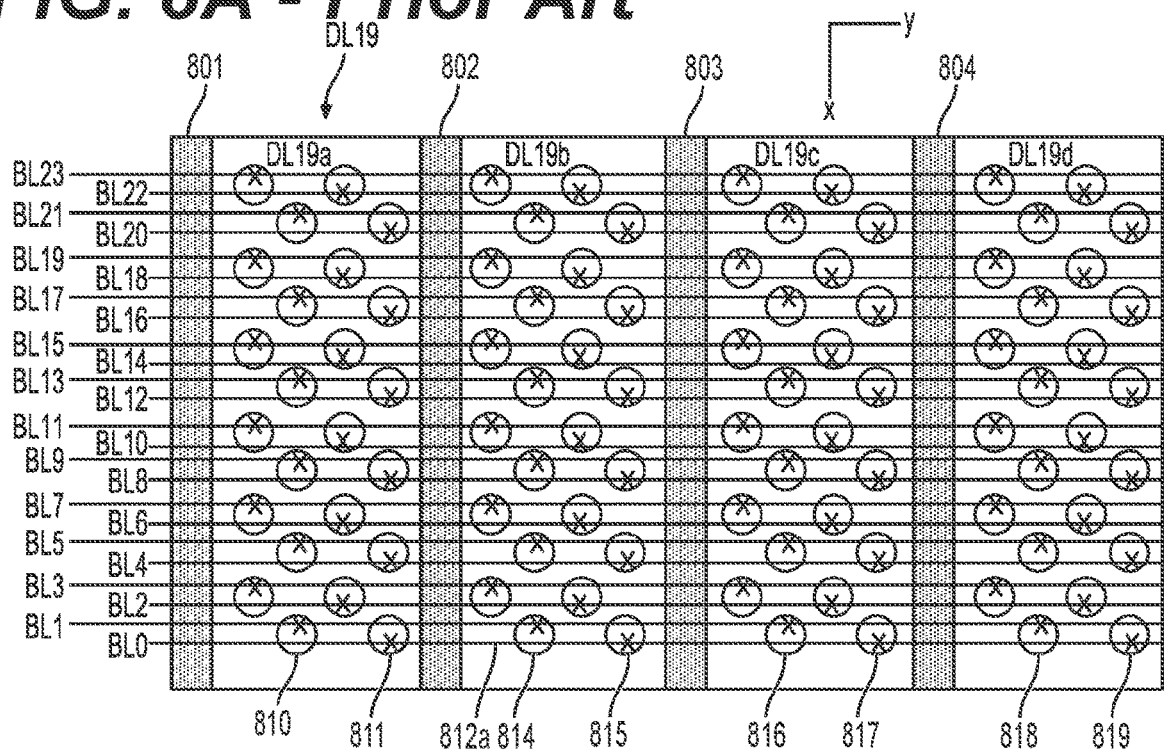
FIG. 8B - Prior Art

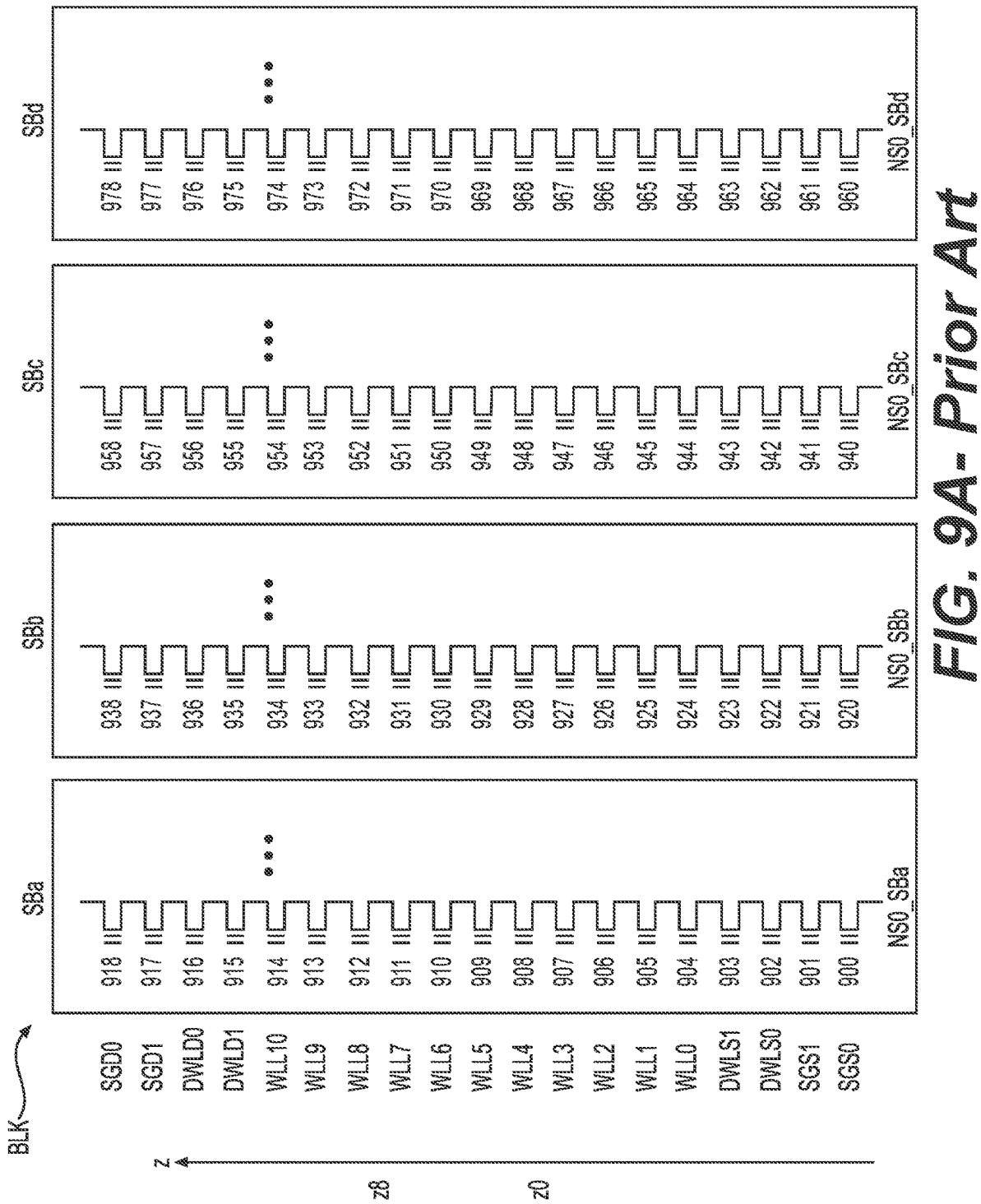
FIG. 9A - Prior Art

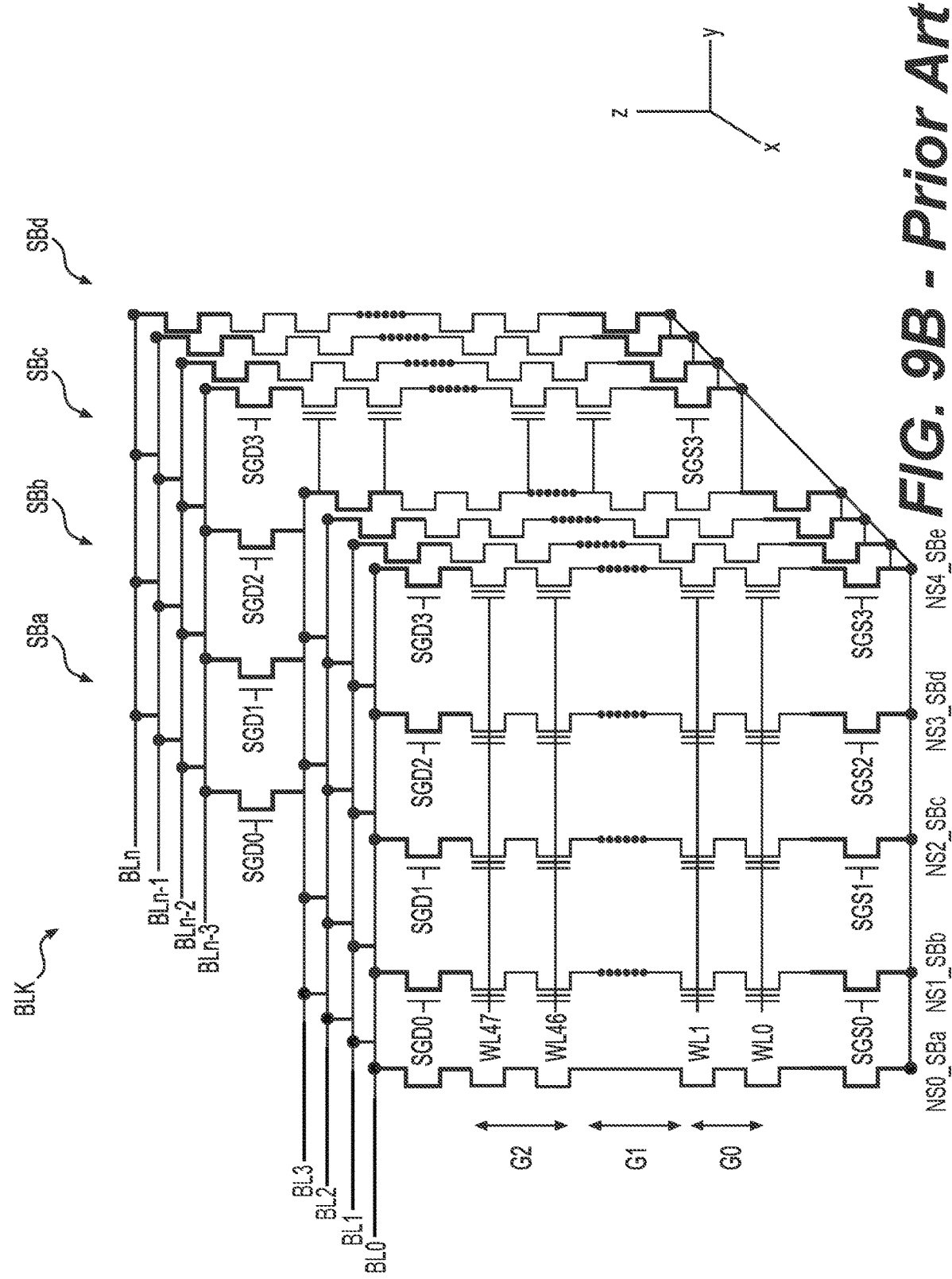
FIG. 9B - Prior Art

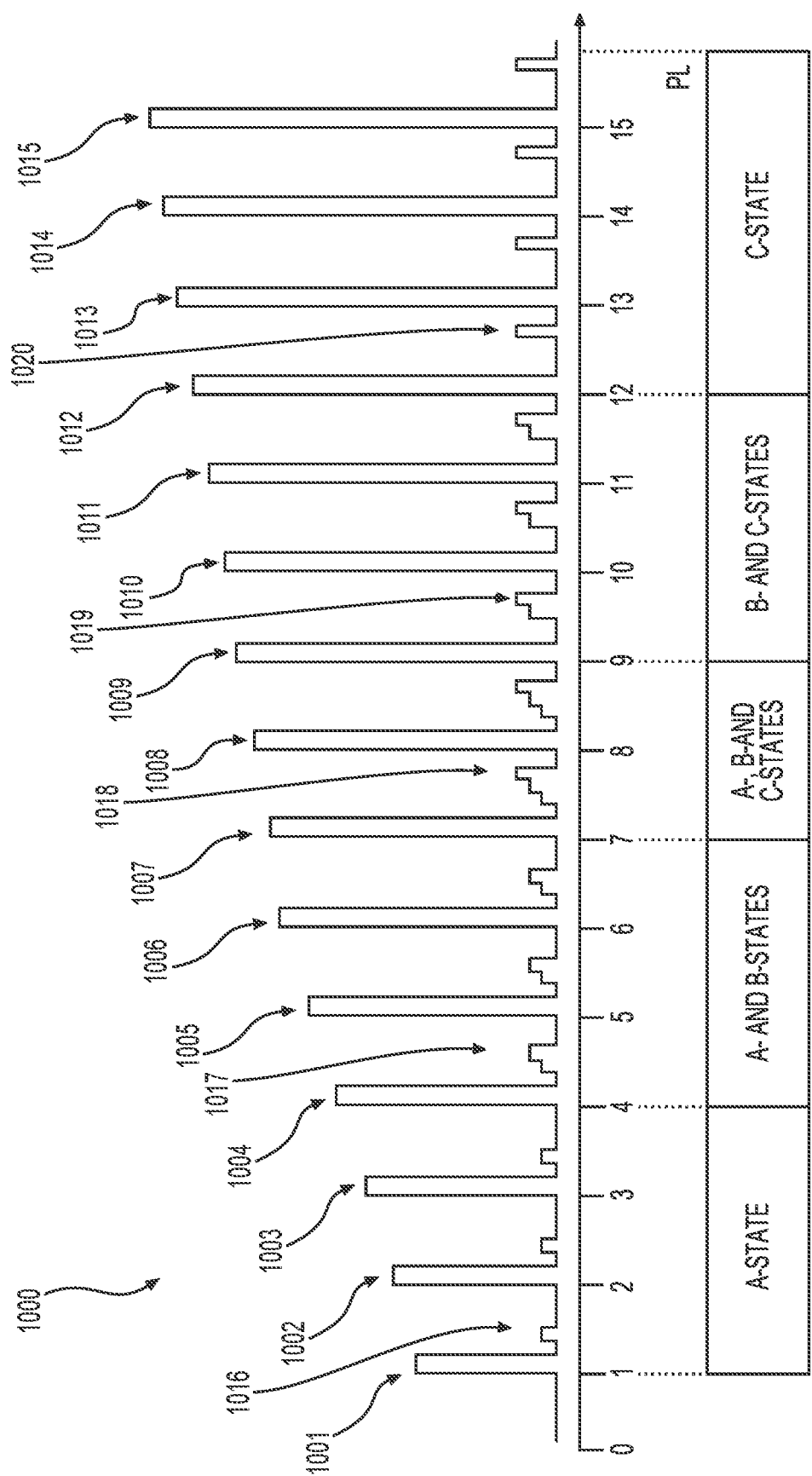
FIG. 10 - Prior Art

PROGRAMMING OF MEMORY CELLS USING A MEMORY STRING DEPENDENT PROGRAM VOLTAGE

BACKGROUND

The present technology relates to the operation of memory devices.

Memory devices are typically provided as internal, semiconductor, integrated circuits in computers or other electronic devices. There are many different types of memory, including random-access memory (RAM), read only memory (ROM), dynamic random access memory (DRAM), synchronous dynamic random access memory (SDRAM), an electrically erasable programmable read-only memory (EEPROM), a flash memory, and/or the like. In an EEPROM or flash NAND array architecture, memory cells may be arranged in a matrix of rows and columns, such that gates of each memory cell are coupled by rows to word lines. The memory cells may be arranged together in strings such that memory cells in a given string are coupled together in series, from source to drain, between a common source line and a common bit line.

SUMMARY

One aspect of the present invention is related to a non-volatile memory device which includes a control circuitry for programming a set of memory cells included in an array of memory strings that is segmented into a set of memory string groups. The control circuitry may be configured to perform a programming operation to program the set of memory cells. Performing the programming operation may include applying a set of biased word line voltages to one or more selected word lines. The set of biased word line voltages may have values that are based on positions of respective memory cells in the array relative to at least one outer memory string group of the set of memory string groups.

Another aspect of the present invention is related to a method of performing a programming operation to program a set of memory cells, wherein said memory cells are included in an array of memory strings that is segmented into a set of memory string groups. The method of performing the programming operation comprises applying a set of biased bit line voltages to bit lines corresponding to the one or more selected word lines, wherein the set of biased bit line voltages have values that are staggered based on positions of respective memory cells in the array relative to at least one outer memory string group of the set of memory string groups. The biased bit line voltages may be capable of causing a change in one or more biased word line voltages at respective memory cells of the one or more selected word lines.

Yet another aspect of the present invention is related to a storage device comprising a non-volatile memory and control circuitry. The control circuitry may be communicatively coupled to the non-volatile memory. The control circuitry may be for programming a set of memory cells included in an array of memory strings. The control circuitry may be configured to perform a programming operation to program the set of memory cells, wherein performing the programming operation comprises applying a set of biased program voltages to lines connecting to respective memory cells in the array. The set of biased program voltages may have values that are staggered based on at least one of: positions of the respective memory cells in the array relative to an outer memory string group of the set of memory string groups, and positions on particular planes relative to the outer memory string group.

BRIEF DESCRIPTION OF THE DRAWINGS

The accompanying drawings, which are incorporated in and constitute a part of this specification illustrate various aspects of the invention and together with the description, serve to explain its principles. Wherever convenient, the same reference numbers will be used throughout the drawings to refer to the same or like elements.

FIG. 3 illustrates blocks of memory cells in an example two-dimensional configuration of a memory array.

FIG. 3B illustrates a cross-sectional view of the structure of FIG. 3A along line 329.

FIG. 4A illustrates a cross-sectional view of example charge-trapping memory cells in NAND strings.

FIG. 4B illustrates a cross-sectional view of the structure of FIG. 4A along line 429.

FIG. 5A illustrates an example block diagram of the sense block SB1 of FIG. 1.

FIG. 5B illustrates another example block diagram of the sense block SB1 of FIG. 1.

FIG. 6B illustrates another example block diagram of the sense block SB1 of FIG. 1.

FIG. 7A illustrates a perspective view of a set of blocks in an example three-dimensional configuration of the memory array of FIG. 1.

FIG. 7C illustrates a plot of memory hole diameter in the stack of FIG. 7B.

FIG. 7D illustrates a close-up view of the region 622 of the stack of FIG. 7B.

FIG. 8A illustrates a top view of an example word line layer WLL0 of the stack of FIG. 6B.

FIG. 8B illustrates a top view of an example top dielectric layer DL19 of the stack of FIG. 67B.

FIG. 9A illustrates example NAND strings in the sub-blocks SBa-SBd of FIG. 8A.

FIG. 9B illustrates another example view of NAND strings in sub-blocks.

FIG. 10 illustrates the Vth distributions of memory cells in an example programming operation with at least four data states.

DETAILED DESCRIPTION

Figure 1:
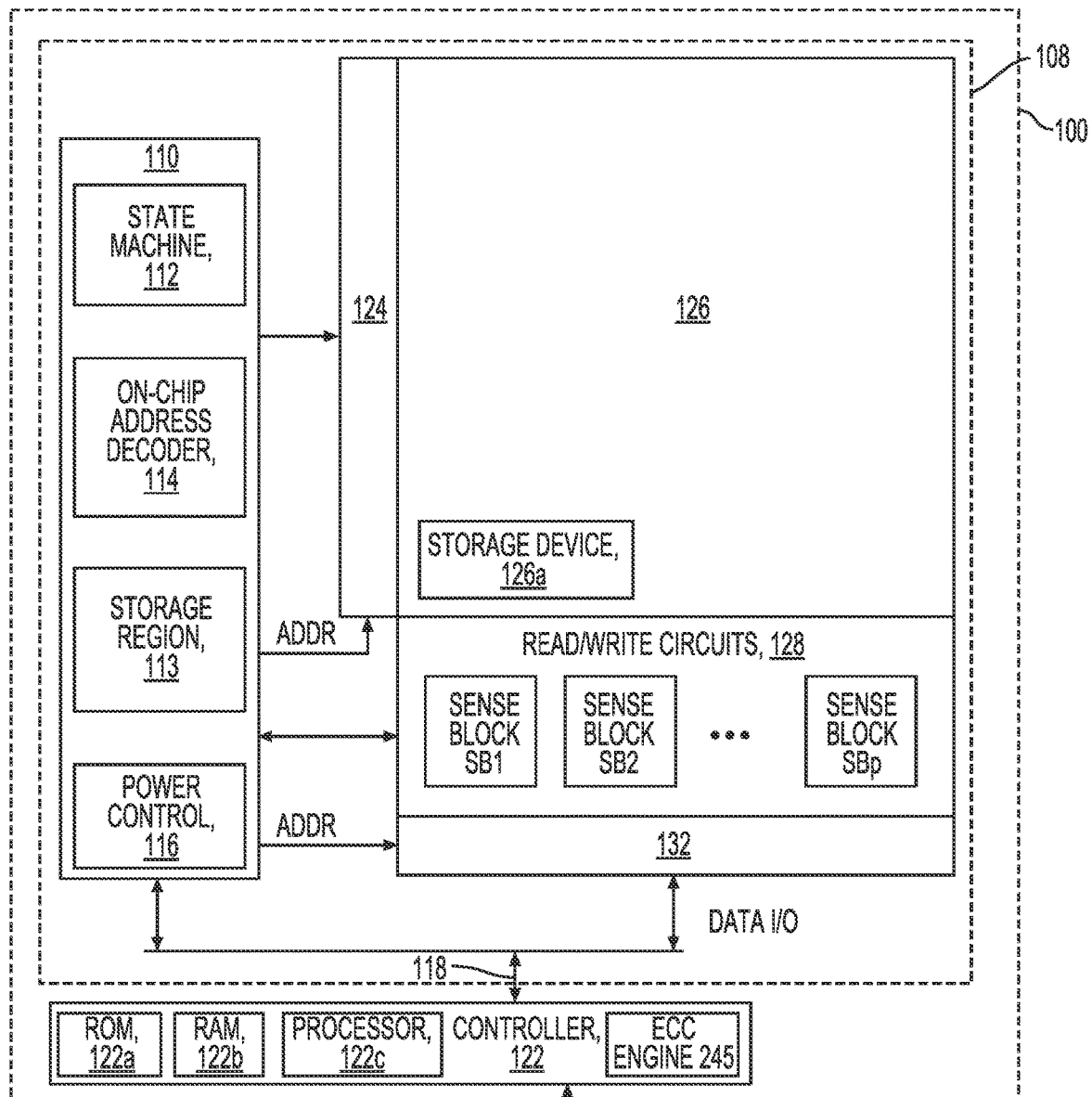
FIG. 1A illustrates a block diagram of an example memory device.
FIG. 1B illustrates a block diagram of an example control circuit which comprises a programming circuit, a counting circuit, and a determination circuit.

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

As described, in an EEPROM or flash NAND array architecture, memory cells may be arranged in a matrix of rows and columns, such that gates of each memory cell are coupled by rows to word lines. The memory cells may be arranged together in strings such that memory cells in a given string are coupled together in series, from source to drain, between a common source line and a common bit line.

Some flash NAND array architectures include an array of memory strings arranged in vertically stacked three-dimensional (3D) memory structures. An example of such a memory structure is a Bit Cost Scaling (BiCS) memory architecture. Recent iterations of the BiCS memory architecture have expanded memory hole staggered patterns. For example, memory hole staggered patterns have expanded to a 16-stagg, a 20-stagg, or more, in two or more tiered vertical three-dimensional (3-D) NAND architectures. A memory string in a BiCS memory architecture may, in some embodiments described herein, be referred to as a NAND string.

To program memory cells included in the array of memory strings, a programming operation may be performed to apply a series of program voltages to the memory cells after the memory cells are provided in an erased state. Each program voltage is provided in a program loop, also referred to as a program-verify iteration. For example, the program voltage may be applied to a word line which is connected to control gates of the memory cells. In one approach, incremental step pulse programming is performed, where the program voltage is increased by a step size in each program loop. When programming is completed for a memory cell, it can be locked out from further programming while programming continues for other memory cells in subsequent program loops.

Each memory cell may be associated with a data state according to write data in a program command. A memory cell can be in an erased data state (referred to herein as an erased state) or can be programmed to a programmed data state (referred to herein as a programmed state) that is different from the erased state. For example, in a two-bit per cell memory device, there are four data states including the erased state and three programmed data states referred to as the A, B and C data states (see FIG. 9). In a three-bit per cell memory device, there are eight data states including the erased state and seven programmed data states referred to as the A, B, C, D, E, F and G data states (see FIG. 10). In a four-bit per cell memory device, there are sixteen data states including the erased state and fifteen programmed data states referred to as the Er, 1, 2, 3, 4, 5, 6, 7, 8, 9, A, B, C, D, E and F data states (see FIG. 11).

When a program command is issued, the write data is stored in latches associated with the memory cells. During programming, the latches of a memory cell can be read to determine the data state to which the cell is to be programmed. Each memory cell is considered to have completed programming when a sensing operation determines that a threshold voltage (Vth) is satisfied by (e.g., above) the associated verify voltage. A sensing operation can determine whether a memory cell has a Vth above the associated verify voltage by applying the associated verify voltage to the control gate and sensing a current through the memory cell. If the current is relatively high, this indicates the memory cell is in a conductive state, such that the Vth is less than the control gate voltage. If the current is relatively low, this indicates the memory cell is in a non-conductive state, such that the Vth is above the control gate voltage.

However, technological improvements have reduced the size of memory circuitry and related hardware, thereby making it difficult to efficiently program the memory cells. For example, by decreasing the size of memory circuitry and related hardware, more memory cells may be placed within a memory architecture. This reduces the amount of physical space between word lines. Consequently, when a memory cell is programmed, noise or electron disturbance from a neighboring memory cell may impact the programming operation, such that additional programming iterations are needed to complete programming of the memory cells. This problem is heightened in memory architectures that utilize 4-bit memory cells and/or that have large numbers of memory holes (e.g., a BiCS 6 memory architecture that has at least 20 memory holes).

Furthermore, in dense memory architectures, a total time needed to program a memory cell may vary based on a position of the memory cell within the memory architecture. For example, a BiCS 6 memory architecture may include an array of NAND strings that may be segmented into N blocks, where each block includes five sub-blocks (e.g., two outer sub-blocks and three inner sub-blocks). Each sub-block may correspond to a NAND string group. NAND string groups may be segmented using contact line connectors. However, because the contact line connects may have different thicknesses, memory cells may complete the programming operating at different time periods.

For example, memory cells in an outer NAND string may complete the programming operation before memory cells of an inner NAND string based on the contact line connectors associated with the inner NAND string having a greater thickness than contact line connectors associated with the outer NAND string. As a specific example, a contact line connector that separates two inner NAND string groups may have a charge-trapping layer that is comprised of tungsten (or another metallic material) that has a thickness that is greater than a thickness of a contact line connector that separates an outer NAND string and an inner NAND string. Consequently, if an equal programming voltage (Vpgm) and programming voltage bias (dVpgm) is used, it will take longer to program memory cells positioned in inner NAND string groups than will be needed to program memory cells positioned in outer NAND string groups.

Some embodiments, described herein, may perform a programming operation to program a set of memory cells included in an array of memory strings. The programming operation may include identifying program voltages (Vpgm) and program voltage biases (dVpgm) to apply to lines (e.g., word lines and/or bit lines) based on memory cells having positions in the array that correspond to one or more memory string groups, based on the memory cells being on a particular plane, and/or the like. In some embodiments, the program voltages may include word line voltages (referred to herein as WLVpgm). Additionally, or alternatively, as used herein, the program voltages may also include bit line voltages (referred to herein as BLVpgm) that cause a change in a corresponding word line voltage when a memory cell is being programmed. A first iteration of the programming operation may be performed by applying the program voltages to the lines. At least one other programming iteration may be performed by determining next-iteration program voltages based on the program voltage biases and applying the next-iteration program voltages to the lines. The next-iteration program voltages may be re-determined and re-applied until the programming operation is complete.

In this way, systems and/or methods described herein improve the performance and reliability of BiCS memory architectures and other multi-tier architectures. For example, by identifying the program voltages and program voltage biases based on the memory cells having positions in particular memory string groups and/or based on being on particular planes, the identified program voltages and program voltage biases are able to offset a programming delay caused by a discrepancy in thickness of the contact line connectors between some of the NAND string groups. Furthermore, this conserves resources (e.g., processing resources, memory resources, and/or the like) by reducing program operation execution time relative to an inferior system or method that does not effectively account for the programming delay caused by the discrepancy in thickness of contact line connectors.

FIG. 1A is a block diagram of an example memory device. The memory device 100 may include one or more memory die 108. The memory die 108 includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks SB1, SB2, . . . , SBp (sensing circuitry) and allow a page of memory cells to be read or programmed in parallel. Typically a controller 122 is included in the same memory device 100 (e.g., a removable storage card) as the one or more memory die 108. Commands and data are transferred between the host 140 and controller 122 via a data bus 120, and between the controller and the one or more memory die 108 via lines 118.

The memory structure can be 2D or 3D. The memory structure may comprise one or more array of memory cells including a 3D array. The memory structure may comprise a monolithic three dimensional memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, an on-chip address decoder 114, and a power control module 116. The state machine 112 provides chip-level control of memory operations.

A storage region 113 may, for example, be provided for programming parameters. The programming parameters may include a program voltage, a program voltage bias, position parameters indicating positions of memory cells, contact line connector thickness parameters, a verify voltage, and/or the like. The position parameters may indicate a position of a memory cell within the entire array of NAND strings, a position of a memory cell as being within a particular NAND string group, a position of a memory cell on a particular plane, and/or the like. The contact line connector thickness parameters may indicate a thickness of a contact line connector, a substrate or material that the contact line connector is comprised of, and/or the like.

The on-chip address decoder 114 provides an address interface between that used by the host or a memory controller to the hardware address used by the decoders 124 and 132. The power control module 116 controls the power and voltages supplied to the word lines and bit lines during memory operations. It can include drivers for word lines, SGS and SGD transistors, and source lines. The sense blocks can include bit line drivers, in one approach. An SGS transistor is a select gate transistor at a source end of a NAND string, and an SGD transistor is a select gate transistor at a drain end of a NAND string.

In some embodiments, some of the components can be combined. In various designs, one or more of the components (alone or in combination), other than memory structure 126, can be thought of as at least one control circuit which is configured to perform the actions described herein. For example, a control circuit may include any one of, or a combination of, control circuitry 110, state machine 112, decoders 114/132, power control module 116, sense blocks SBb, SB2, . . . , SBp, read/write circuits 128, controller 122, and so forth.

The control circuits can include a programming circuit configured to perform a programming operation for one set of memory cells, wherein the one set of memory cells comprises memory cells assigned to represent one data state among a plurality of data states and memory cells assigned to represent another data state among the plurality of data states; the programming operation comprising a plurality of program-verify iterations; and in each program-verify iteration, the programming circuit performs programming for the one word line after which the programming circuit applies a verification signal to the one word line. The control circuits can also include a counting circuit configured to obtain a count of memory cells which pass a verify test for the one data state. The control circuits can also include a determination circuit configured to determine, based on an amount by which the count exceeds a threshold, a particular program-verify iteration among the plurality of program-verify iterations in which to perform a verify test for the another data state for the memory cells assigned to represent the another data state.

For example, FIG. 1B is a block diagram of an example control circuit 150 which comprises a programming circuit 151, a counting circuit 152 and a determination circuit 153.

The off-chip controller 122 may comprise a processor 122c, storage devices (memory) such as ROM 122a and RAM 122b and an error-correction code (ECC) engine 245. The ECC engine can correct a number of read errors which are caused when the upper tail of a Vth distribution becomes too high. However, uncorrectable errors may exists in some cases. The techniques provided herein reduce the likelihood of uncorrectable errors.

The storage device comprises code such as a set of instructions, and the processor is operable to execute the set of instructions to provide the functionality described herein. Alternatively or additionally, the processor can access code from a storage device 126a of the memory structure, such as a reserved area of memory cells in one or more word lines.

For example, code can be used by the controller to access the memory structure such as for programming, read and erase operations. The code can include boot code and control code (e.g., set of instructions). The boot code is software that initializes the controller during a booting or startup process and enables the controller to access the memory structure. The code can be used by the controller to control one or more memory structures. Upon being powered up, the processor 122c fetches the boot code from the ROM 122a or storage device 126a for execution, and the boot code initializes the system components and loads the control code into the RAM 122b. Once the control code is loaded into the RAM, it is executed by the processor. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below and provide the voltage waveforms including those discussed further below.

In one embodiment, the host is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, non-volatile memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and non-volatile memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, non-volatile memory devices in a NAND configuration (NAND memory) typically contain memory elements connected in series. A NAND string is an example of a set of series-connected transistors comprising memory cells and SG transistors.

A NAND memory array may be configured so that the array is composed of multiple memory strings in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured. The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the z-direction is substantially perpendicular and the x- and y-directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements. The columns may be arranged in a two dimensional configuration, e.g., in an x-y plane, resulting in a three dimensional arrangement of memory elements with elements on multiple vertically stacked memory planes. Other configurations of memory elements in three dimensions can also constitute a three dimensional memory array.

By way of non-limiting example, in a three dimensional array of NAND strings, the memory elements may be coupled together to form a NAND string within a single horizontal (e.g., x-y) memory device level. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Figure 2:
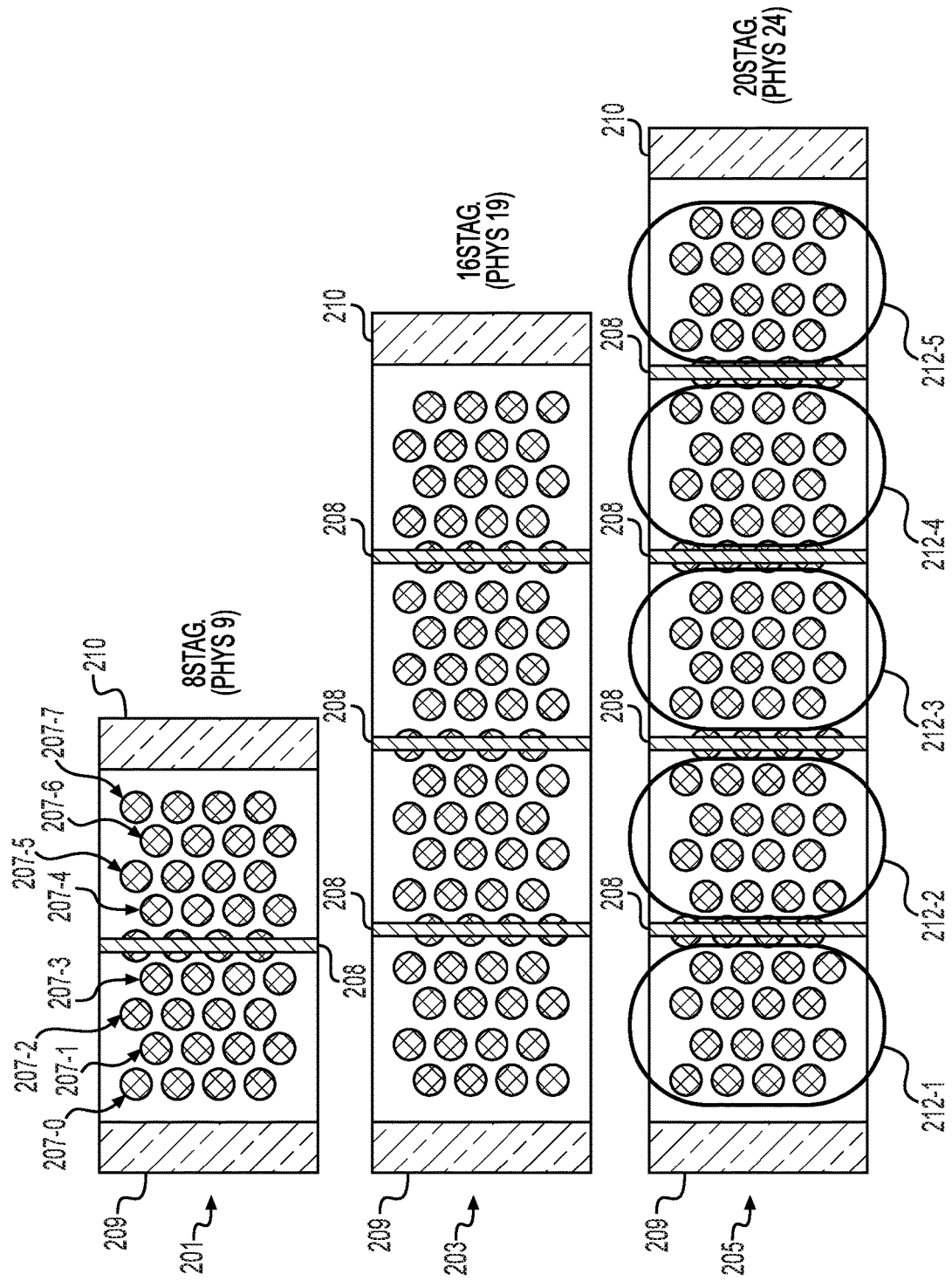
FIG. 2 illustrates a schematic view of three memory string architectures according to the principles of the present disclosure.

FIG. 2 illustrates a schematic view of example BiCS memory architectures utilizing staggered memory strings. For example, reference number 201 shows a schematic view of an example BiCS 4 memory architecture, reference number 203 shows a schematic view of an example BiCS 5 memory architecture, and reference number 205 shows a schematic view of an example BiCS 6 memory architecture. In some embodiments, as shown, a BiCS memory architecture may include an array of staggered NAND strings.

With reference to memory architecture 201, the memory strings are shown in rows 207-0 through 207-7 in string architecture 201. A memory string may include a set of memory cells (e.g., which correspond to a set of memory holes). Each row is shown with four ends to the memory strings. A memory string may be connected to an adjacent string at an end (not visible beneath this view). A first group of rows 207-0 through 207-3 of shown on a left side of a dummy row 208. A second group of rows 207-4 through 207-7 of shown on a right side of the dummy row 208. The dummy row 208 separates the two groups of rows in the staggered eight row. A source line 209 is positioned at an edge of the first group and is remote from the dummy row 208. A source line 210 is positioned at an edge of the second group and is remote from the dummy row 208 and source line 209.

The memory architectures 203 and 205 may be similar to that of string architecture 201 except additional groups are added. String architecture 203 may be double the size of architecture 201 and may include sixteen rows of strings with each group of four rows separated by a dummy row. String architecture 205 may be larger than both the memory architecture 201 and the memory architecture 203. String architecture 205 may include twenty rows of strings with each group of four rows separated by a dummy row 208.

In some embodiments, memory architectures 201, 203, and/or 205 may include a chip under array structure. For example, memory architectures 201, 203, and/or 205 may include a chip under array structure whereby the control circuitry is under the memory array that includes the groups of memory strings. With the chip under array structure, the memory strings may include a direct strap contact for the source line for read and erase operations.

In some embodiments, the memory architecture 205 may be a BiCS 6 memory architecture. For example, in a BiCS 6 memory architecture, there may be five NAND string groups. NAND string group 212-1, NAND string group 212-2, NAND string group 212-3, NAND string group 212-3, and NAND string group 212-4). NAND string group 212-0 and NAND string group 212-4 may be referred to as outer NAND string groups. NAND string group 212-1, NAND string group 212-2, and NAND string group 212-3 may be referred to collectively as inner NAND string groups. NAND string group 212-2 may be referred to as an inner-most NAND string group.

In some embodiments, the BiCS 6 memory architecture may be a 3-D memory architecture that includes one or more 3-D blocks. In this case, a 3-D block may be logically segmented into multiple sub-blocks corresponding to NAND string groups. The 3-D block may also be segmented into multiple planes. Additional block description is provided further herein.

While one or more embodiments refer to a BiCS memory architecture, it is to be understood that this is provided by way of example. In practice, the techniques described herein may be implemented on any number of different memory architectures, such as pipe-shaped BiCS (P-BiCS), a vertical recess array transistor (VRAT) architecture, and/or any other type of EEPROM or flash memory architecture.

FIG. 3 illustrates blocks of memory cells in an example two-dimensional configuration of the memory array 126 of FIG. 1. The memory array can include many blocks. Each example block 300, 310 includes a number of NAND strings and respective bit lines, e.g., BL0, BL1, . . . which are shared among the blocks. Each NAND string is connected at one end to a drain select gate (SGD), and the control gates of the drain select gates are connected via a common SGD line. The NAND strings are connected at their other end to a source select gate which, in turn, is connected to a common source line 320. Sixteen word lines, for example, WL0-WL15, extend between the source select gates and the drain select gates. In some cases, dummy word lines, which contain no user data, can also be used in the memory array adjacent to the select gate transistors. Such dummy word lines can shield the edge data word line from certain edge effects.

One type of non-volatile memory which may be provided in the memory array is a floating gate memory. See FIGS. 4A and 4B. Other types of non-volatile memory can also be used. For example, a charge-trapping memory cell uses a non-conductive dielectric material in place of a conductive floating gate to store charge in a non-volatile manner. See FIGS. 5A and 5B. A triple layer dielectric formed of silicon oxide, silicon nitride and silicon oxide ("ONO") is sandwiched between a conductive control gate and a surface of a semi-conductive substrate above the memory cell channel.

The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. A similar cell can be provided in a split-gate configuration where a doped polysilicon gate extends over a portion of the memory cell channel to form a separate select transistor.

In another approach, NROM cells are used. Two bits, for example, are stored in each NROM cell, where an ONO dielectric layer extends across the channel between source and drain diffusions. The charge for one data bit is localized in the dielectric layer adjacent to the drain, and the charge for the other data bit localized in the dielectric layer adjacent to the source. Multi-state data storage is obtained by separately reading binary states of the spatially separated charge storage regions within the dielectric. Other types of non-volatile memory are also known.

FIG. 4A illustrates a cross-sectional view of example floating gate memory cells in NAND strings. A bit line or NAND string direction goes into the page, and a word line direction goes from left to right. As an example, word line 424 extends across NAND strings which include respective channel regions 406, 416 and 426. The memory cell 400 includes a control gate 402, a floating gate 404, a tunnel oxide layer 405 and the channel region 406. The memory cell 410 includes a control gate 412, a floating gate 414, a tunnel oxide layer 415 and the channel region 416. The memory cell 420 includes a control gate 422, a floating gate 421, a tunnel oxide layer 425 and the channel region 426. Each memory cell is in a different respective NAND string. An inter-poly dielectric (IPD) layer 428 is also illustrated. The control gates are portions of the word line. A cross-sectional view along contact line connector 429 is provided in FIG. 4B.

The control gate wraps around the floating gate, increasing the surface contact area between the control gate and floating gate. This results in higher IPD capacitance, leading to a higher coupling ratio which makes programming and erase easier. However, as NAND memory devices are scaled down, the spacing between neighboring cells becomes smaller so there is almost no space for the control gate and the IPD between two adjacent floating gates.

As an alternative, as shown in FIGS. 5A and 5B, the flat or planar memory cell has been developed in which the control gate is flat or planar; that is, it does not wrap around the floating gate, and its only contact with the charge storage layer is from above it. In this case, there is no advantage in having a tall floating gate. Instead, the floating gate is made much thinner. Further, the floating gate can be used to store charge, or a thin charge trap layer can be used to trap charge. This approach can avoid the issue of ballistic electron transport, where an electron can travel through the floating gate after tunneling through the tunnel oxide during programming.

FIG. 5B illustrates a cross-sectional view of the structure of FIG. 5A along contact line connector 529. The NAND string 530 includes an SGS transistor 531, example memory cells 500, 533, . . . , 534 and 535, and an SGD transistor 536. The memory cell 400, as an example of each memory cell, includes the control gate 402, the IPD layer 428, the floating gate 404 and the tunnel oxide layer 505, consistent with FIG. 5A. Passageways in the IPD layer in the SGS and SGD transistors allow the control gate layers and floating gate layers to communicate. The control gate and floating gate layers may be polysilicon and the tunnel oxide layer may be silicon oxide, for instance. The IPD layer can be a stack of nitrides (N) and oxides (O) such as in a N—O—N—O—N configuration.

The NAND string may be formed on a substrate which comprises a p-type substrate region 555, an n-type well 556 and a p-type well 557. N-type source/drain diffusion regions sd1, sd2, sd3, sd4, sd5, sd6 and sd7 are formed in the p-type well. A channel voltage, Vch, may be applied directly to the channel region of the substrate.

Figure 6A:
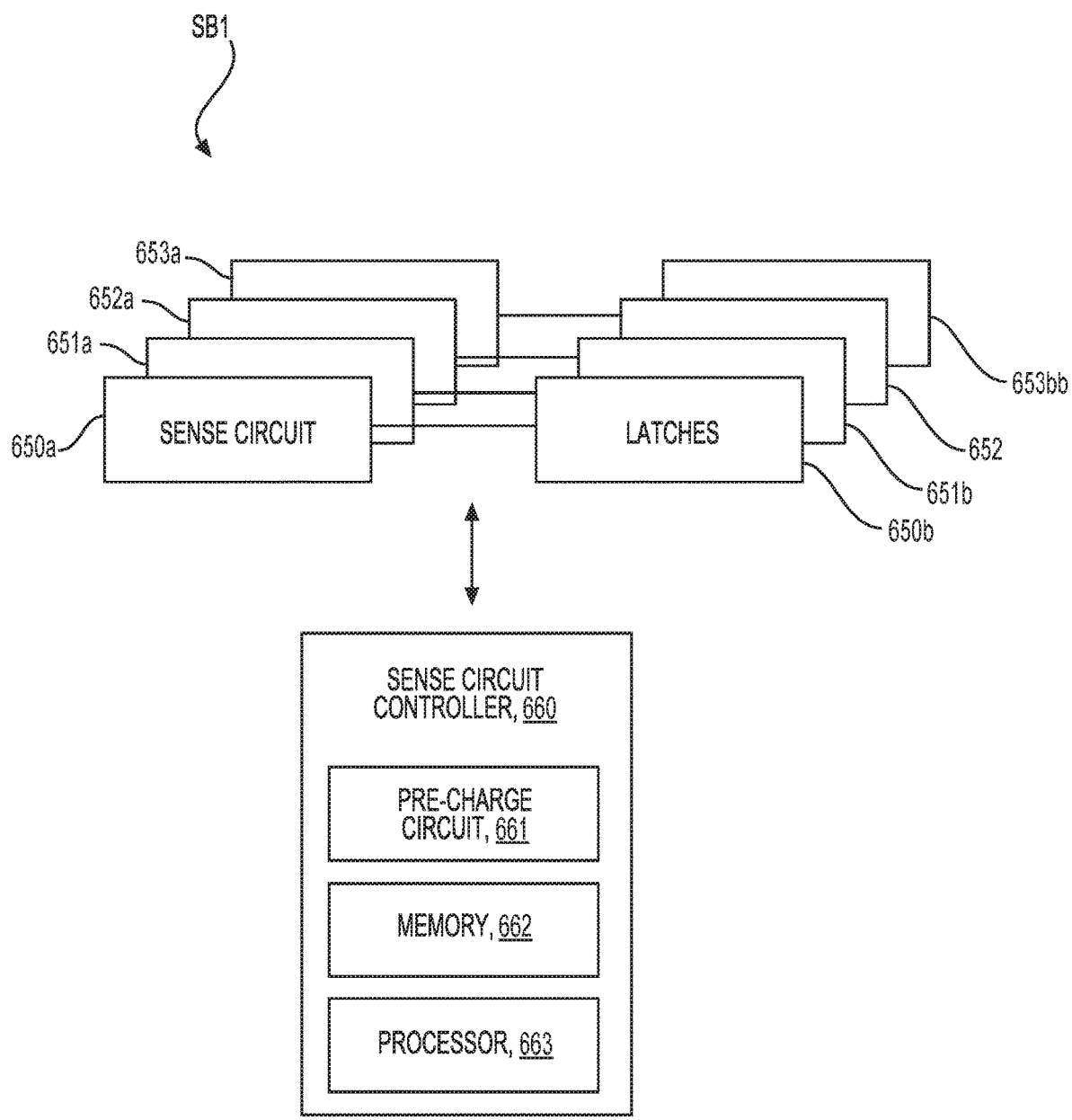
FIG. 6A illustrates an example block diagram of the sense block SB1 of FIG. 1.

FIG. 6A illustrates an example block diagram of the sense block SB1 of FIG. 1. In one approach, a sense block comprises multiple sense circuits. Each sense circuit is associated with data latches. For example, the example sense circuits 650a, 651a, 652a and 553a are associated with the data latches 650b, 551b, 652b and 653b, respectively. In one approach, different subsets of bit lines can be sensed using different respective sense blocks. This allows the processing load which is associated with the sense circuits to be divided up and handled by a respective processor in each sense block. For example, a sense circuit controller 660 in SB1 can communicate with the set of sense circuits and latches. The sense circuit controller may include a pre-charge circuit 661 which provides a voltage to each sense circuit for setting a pre-charge voltage. In one possible approach, the voltage is provided to each sense circuit independently, e.g., via the data bus 603 and a local bus such as LBUS1 or LBUS2 in FIG. 6B. In another possible approach, a common voltage is provided to each sense circuit concurrently, e.g., via the contact line 605 in FIG. 6B. The sense circuit controller may also include a memory 662 and a processor 663. The memory 662 may store code which is executable by the processor to perform the functions described herein. These functions can include reading latches which are associated with the sense circuits, setting bit values in the latches and providing voltages for setting pre-charge levels in sense nodes of the sense circuits. Further example details of the sense circuit controller and the sense circuits 650a and 651a are provided below.

The sense circuit controller can communicate with different sense circuits in a time-multiplexed manner, for instance. A contact line 605 may be connected to the voltage clamp in each sense circuit, in one approach.

The sense circuit 651a includes latches 651b, including a trip latch 646, an offset verify latch 647 and data state latches 648. A voltage clamp 641 may be used to set a pre-charge voltage at a sense node 642. A sense node to bit line (BL) switch 643 selectively allows the sense node to communicate with a bit line 645, and a voltage clamp 644 can set a voltage on the bit line. The bit line 645 is connected to one or more memory cells such as a memory cell MC2. A local bus, LBUS2, allows the sense circuit controller to communicate with components in the sense circuit, such as the latches 651b and the voltage clamp in some cases. To communicate with the sense circuit 651a, the sense circuit controller provides a voltage via a contact line 601 to a transistor 606 to connect LBUS2 with DBUS.

The sense circuit 650a may be a first sense circuit which comprises a first trip latch 626 and the sense circuit 651a may be a second sense circuit which comprises a second trip latch 646.

The sense circuit 650a is an example of a first sense circuit comprising a first sense node 622, where the first sense circuit is associated with a first memory cell MC1 and a first bit line 625. The sense circuit 651a is an example of a second sense circuit comprising a second sense node 642, where the second sense circuit is associated with a second memory cell MC2 and a second bit line 645.

FIG. 6B illustrates another example block diagram of the sense block SB1 of FIG. 1. The sense circuit controller 660 communicates with multiple sense circuits including example sense circuits 650a and 651a, also shown in FIG. 6A. The sense circuit 650a includes latches 650b, including a trip latch 626, an offset verify latch 627 and data state latches 628. The sense circuit further includes a voltage clamp 621 such as a transistor which sets a pre-charge voltage at a sense node 622. A sense node to bit line (BL) switch 623 selectively allows the sense node to communicate with a bit line 625, e.g., the sense node is electrically connected to the bit line so that the sense node voltage can decay. The bit line 625 is connected to one or more memory cells such as a memory cell MC1. A voltage clamp 624 can set a voltage on the bit line, such as during a sensing operation or during a program voltage. A local bus, LBUS1, allows the sense circuit controller to communicate with components in the sense circuit, such as the latches 650b and the voltage clamp in some cases. To communicate with the sense circuit 650a, the sense circuit controller provides a voltage via a contact line 602 to a transistor 604 to connect LBUS1 with a data bus DBUS 603. The communicating can include sending data to the sense circuit and/or receive data from the sense circuit.

FIG. 7A is a perspective view of a set of blocks 700 in an example three-dimensional configuration of the memory array 126 of FIG. 1. On the substrate are example blocks BLK0, BLK1, BLK2 and BLK3 of memory cells (storage elements) and a peripheral area 704 with circuitry for use by the blocks. For example, the circuitry can include voltage drivers 705 which can be connected to control gate layers of the blocks. In one approach, control gate layers at a common height in the blocks are commonly driven. The substrate 701 can also carry circuitry under the blocks, along with one or more lower metal layers which are patterned in conductive paths to carry signals of the circuitry. The blocks are formed in an intermediate region 702 of the memory device. In an upper region 703 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While four blocks are illustrated as an example, two or more blocks can be used, extending in the x- and/or y-directions.

In one possible approach, the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device.

Figure 7B:
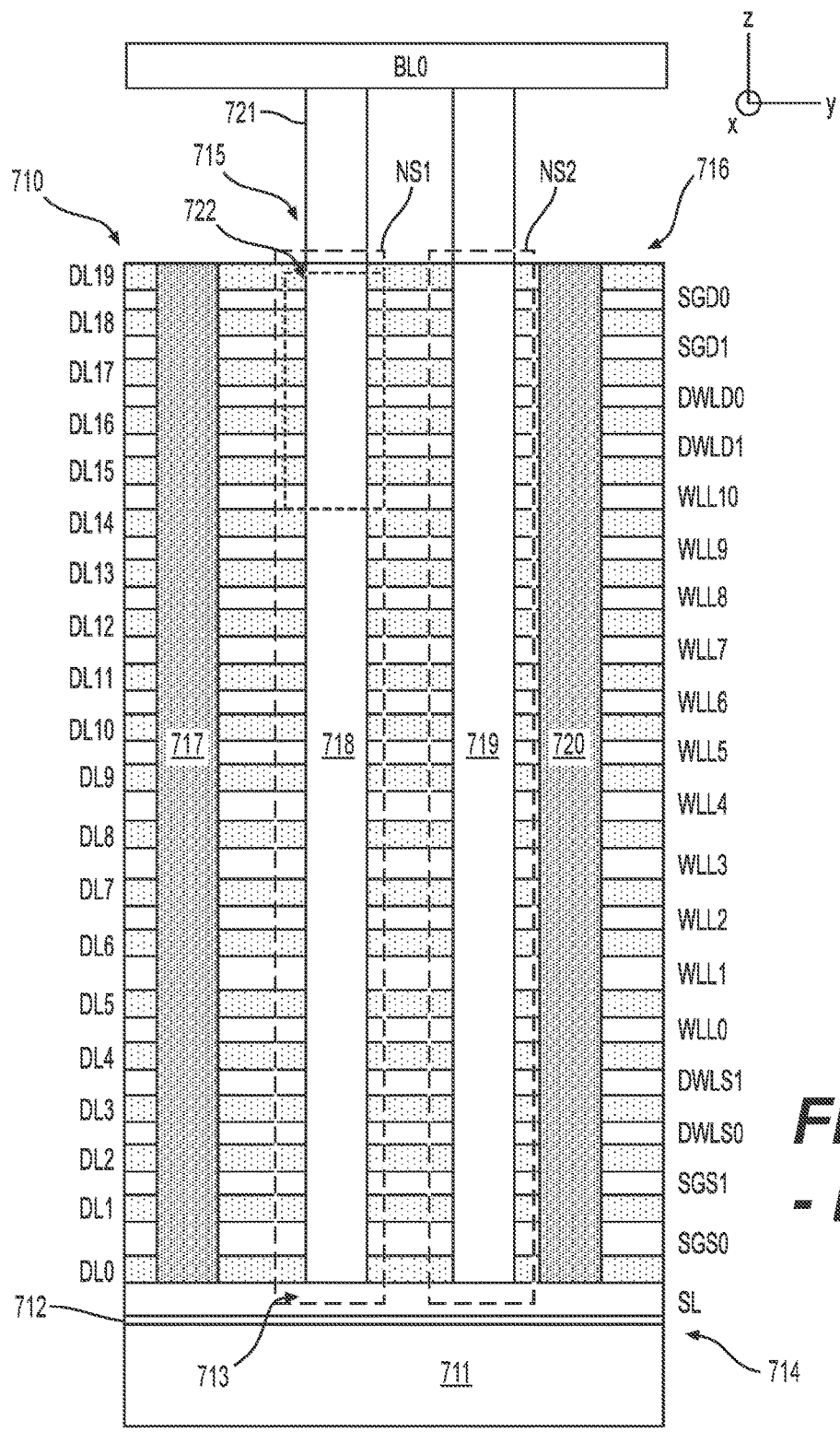
FIG. 7B illustrates an example cross-sectional view of a portion of one of the blocks of FIG. 7A.

FIG. 7B illustrates an example cross-sectional view of a portion of one of the blocks of FIG. 7A. The block comprises a stack 710 of alternating conductive and dielectric layers. In this example, the conductive layers comprise two SGD layers, two SGS layers and four dummy word line layers DWLD0, DWLD1, DWLS0 and DWLS1, in addition to data word line layers (word lines) WLL0-WLL10. The dielectric layers are labelled as DL0-DL19. Further, regions of the stack which comprise NAND strings NS1 and NS2 are illustrated. Each NAND string encompasses a memory hole 718 or 719 which is filled with materials which form memory cells adjacent to the word lines. A region 722 of the stack is shown in greater detail in FIG. 7D.

The stack includes a substrate 711, an insulating film 712 on the substrate, and a portion of a source line SL. NS1 has a source-end 713 at a bottom 714 of the stack and a drain-end 715 at a top 716 of the stack. Contact line connectors (e.g., slits, such as metal-filled slits) 717 and 720 may be provided periodically across the stack as interconnects which extend through the stack, such as to connect the source line to a particular contact line above the stack. The contact line connectors may be used during the formation of the word lines and subsequently filled with metal. A portion of a bit line BL0 is also illustrated. A conductive via 721 connects the drain-end 715 to BL0.

FIG. 7C illustrates a plot of memory hole diameter in the stack of FIG. 7B. The vertical axis is aligned with the stack of FIG. 7B and illustrates a width (wMH), e.g., diameter, of the memory holes 718 and 719. The word line layers WLL0-WLL10 of FIG. 7A are repeated as an example and are at respective heights z0-z10 in the stack. In such a memory device, the memory holes which are etched through the stack have a very high aspect ratio. For example, a depth-to-diameter ratio of about 25-30 is common. The memory holes may have a circular cross-section. Due to the etching process, the memory hole width can vary along the length of the hole. Typically, the diameter becomes progressively smaller from the top to the bottom of the memory hole. That is, the memory holes are tapered, narrowing at the bottom of the stack. In some cases, a slight narrowing occurs at the top of the hole near the select gate so that the diameter becomes slightly wider before becoming progressively smaller from the top to the bottom of the memory hole.

Due to the non-uniformity in the width of the memory hole, the programming speed, including the program slope and erase speed of the memory cells can vary based on their position along the memory hole, e.g., based on their height in the stack. With a smaller diameter memory hole, the electric field across the tunnel oxide is relatively stronger, so that the programming and erase speed is relatively higher. One approach is to define groups of adjacent word lines for which the memory hole diameter is similar, e.g., within a defined range of diameter, and to apply an optimized verify scheme for each word line in a group. Different groups can have different optimized verify schemes.

FIG. 7D illustrates a close-up view of the region 722 of the stack of FIG. 7B. Memory cells are formed at the different levels of the stack at the intersection of a word line layer and a memory hole. In this example, SGD transistors 780 and 781 are provided above dummy memory cells 782 and 783 and a data memory cell MC. A number of layers can be deposited along the sidewall (SW) of the memory hole 730 and/or within each word line layer, e.g., using atomic layer deposition. For example, each column (e.g., the pillar which is formed by the materials within a memory hole) can include a charge-trapping layer or film 763 such as SiN or other nitride, a tunneling layer 664, a polysilicon body or channel 765, and a dielectric core 766. A word line layer can include a blocking oxide/block high-k material 760, a metal barrier 761, and a conductive metal 762 such as Tungsten as a control gate. For example, control gates 790, 791, 792, 793 and 794 are provided. In this example, all of the layers except the metal are provided in the memory hole. In other approaches, some of the layers can be in the control gate layer. Additional pillars are similarly formed in the different memory holes. A pillar can form a columnar active area (AA) of a NAND string.

When a memory cell is programmed, electrons are stored in a portion of the charge-trapping layer which is associated with the memory cell. These electrons are drawn into the charge-trapping layer from the channel, and through the tunneling layer.

The Vth of a memory cell is increased in proportion to the amount of stored charge. During an erase operation, the electrons return to the channel.

Each of the memory holes can be filled with a plurality of annular layers comprising a blocking oxide layer, a charge trapping layer, a tunneling layer and a channel layer. A core region of each of the memory holes is filled with a body material, and the plurality of annular layers are between the core region and the word line in each of the memory holes.

The NAND string can be considered to have a floating body channel because the length of the channel is not formed on a substrate. Further, the NAND string is provided by a plurality of word line layers above one another in a stack, and separated from one another by dielectric layers.

FIG. 8A illustrates a top view of an example word line layer WLL0 of the stack of FIG. 7B. As mentioned, a 3D memory device can comprise a stack of alternating conductive and dielectric layers. The conductive layers provide the control gates of the SG transistors and memory cells. The layers used for the SG transistors are SG layers and the layers used for the memory cells are word line layers. Further, memory holes are formed in the stack and filled with a charge-trapping material and a channel material. As a result, a vertical NAND string is formed. Source lines are connected to the NAND strings below the stack and bit lines are connected to the NAND strings above the stack.

A block BLK in a 3D memory device can be divided into sub-blocks, where each sub-block comprises a NAND string group which has a common SGD control line. For example, see the SGD lines/control gates SGD0, SGD1, SGD2 and SGD3 in the sub-blocks SBa, SBb, SBc and SBd, respectively. Further, a word line layer in a block can be divided into regions. Each region is in a respective sub-block and can extend between contact line connectors (e.g., slits) which are formed periodically in the stack to process the word line layers during the fabrication process of the memory device. This processing can include replacing a sacrificial material of the word line layers with metal. Generally, the distance between contact line connectors should be relatively small to account for a limit in the distance that an etchant can travel laterally to remove the sacrificial material, and that the metal can travel to fill a void which is created by the removal of the sacrificial material. For example, the distance between contact line connectors may allow for a few rows of memory holes between adjacent contact line connectors. The layout of the memory holes and contact line connectors should also account for a limit in the number of bit lines which can extend across the region while each bit line is connected to a different memory cell. After processing the word line layers, the contact line connectors can optionally be filed with metal to provide an interconnect through the stack.

In this example, there are four rows of memory holes between adjacent contact line connectors. A row here is a group of memory holes which are aligned in the x-direction. Moreover, the rows of memory holes are in a staggered pattern to increase the density of the memory holes. The word line layer or word line is divided into regions WLL0a, WLL0b, WLL0c and WLL0d which are each connected by a contact line 813. The last region of a word line layer in a block can be connected to a first region of a word line layer in a next block, in one approach. The contact line 813, in turn, is connected to a voltage driver for the word line layer. The region WLL0a has example memory holes 810 and 811 along a contact line 812. The region WLL0b has example memory holes 814 and 815. The region WLL0 c has example memory holes 816 and 817. The region WLL0 d has example memory holes 818 and 819. The memory holes are also shown in FIG. 8B. Each memory hole can be part of a respective NAND string. For example, the memory holes 810, 814, 816 and 818 can be part of NAND strings NS0_SBa, NS1_SBb, NS2_SBc, NS3_SBd, and NS4_SBe, respectively.

Each circle represents the cross-section of a memory hole at a word line layer or SG layer. Example circles shown with dashed lines represent memory cells which are provided by the materials in the memory hole and by the adjacent word line layer. For example, memory cells 820 and 821 are in WLL0a, memory cells 824 and 825 are in WLL0b, memory cells 826 and 827 are in WLL0c, and memory cells 828 and 829 are in WLL0d. These memory cells are at a common height in the stack.

Contact line connectors (e.g., slits, such as metal-filled slits) 801, 802, 803 and 804 may be located between and adjacent to the edges of the regions WLL0a-WLL0d. The contact line connectors provide a conductive path from the bottom of the stack to the top of the stack. For example, a source line at the bottom of the stack may be connected to a conductive line above the stack, where the conductive line is connected to a voltage driver in a peripheral region of the memory device. See also FIG. 9A for further details of the sub-blocks SBa-SBd of FIG. 8A.

FIG. 8B illustrates a top view of an example top dielectric layer DL19 of the stack of FIG. 7B. The dielectric layer is divided into regions DL19a, DL19b, DL19c and DL19d. Each region can be connected to a respective voltage driver. This allows a set of memory cells in one region of a word line layer to be programmed concurrently, with each memory cell being in a respective NAND string which is connected to a respective bit line. A voltage can be set on each bit line to allow or inhibit programming during each program voltage.

The region DL19a has the example memory holes 810 and 811 along a contact line 812a which is coincident with a bit line BL0. A number of bit lines extend above the memory holes and are connected to the memory holes as indicated by the "X" symbols. BL0 is connected to a set of memory holes which includes the memory holes 811, 815, 817 and 819. Another example bit line BL1 is connected to a set of memory holes which includes the memory holes 810, 814, 816 and 818. The contact line connectors (e.g., slits, such as metal-filled slits) 801, 802, 803 and 804 from FIG. 8A are also illustrated, as they extend vertically through the stack. The bit lines can be numbered in a sequence BL0-BL23 across the DL19 layer in the −x direction.

Different subsets of bit lines are connected to memory cells in different rows. For example, BL0, BL4, BL8, BL12, BL16, and BL20 are connected to memory cells in a first row of cells at the right hand edge of each region. BL2, BL6, BL10, BL14, BL18, and BL22 are connected to memory cells in an adjacent row of cells, adjacent to the first row at the right hand edge. BL3, BL7, BL11, BL15, BL19, and BL23 are connected to memory cells in a first row of cells at the left hand edge of each region. BL1, BL5, BL9, BL13, BL17, and BL21 are connected to memory cells in an adjacent row of memory cells, adjacent to the first row at the left hand edge.

FIG. 9A illustrates example NAND strings in the sub-blocks SBa-SBe of FIG. 8A. The sub-blocks are consistent with the structure of FIG. 7B. The conductive layers in the stack are illustrated for reference at the left hand side. Each sub-block includes multiple NAND strings, where one example NAND string is illustrated. For example, SBa comprises an example NAND string NS0, SBb comprises an example NAND string NS1, SBc comprises an example NAND string NS2, SBd comprises an example NAND string NS3, and SBe comprises an example NAND string NS4.

Additionally, NS0_SBa include SGS transistors 900 and 901, dummy memory cells 902 and 903, data memory cells 904, 905, 906, 907, 908, 909, 910, 911, 912, 913 and 914, dummy memory cells 915 and 916, and SGD transistors 917 and 918.

NS1_SBb include SGS transistors 920 and 921, dummy memory cells 922 and 923, data memory cells 924, 925, 926, 927, 928, 929, 930, 931, 932, 933 and 934, dummy memory cells 935 and 936, and SGD transistors 937 and 938.

NS2_SBc include SGS transistors 940 and 941, dummy memory cells 942 and 843, data memory cells 944, 945, 946, 947, 948, 949, 950, 951, 952, 953 and 954, dummy memory cells 955 and 956, and SGD transistors 957 and 958.

NS3_SBd include SGS transistors 960 and 961, dummy memory cells 962 and 963, data memory cells 964, 965, 966, 967, 968, 969, 970, 971, 972, 973 and 974, dummy memory cells 975 and 976, and SGD transistors 977 and 978.

NS4_SBe include SGS transistors 980 and 981, dummy memory cells 982 and 983, data memory cells 984, 985, 986, 987, 988, 989, 980, 981, 982, 983 and 984, dummy memory cells 985 and 986, and SGD transistors 987 and 988.

At a given height in the block, memory cells in each sub-block are at a common height. For example, one set of memory cells (including the memory cell 904) is among a plurality of memory cells formed along tapered memory holes in a stack of alternating conductive and dielectric layers. The one set of memory cells is at a particular height z0 in the stack. Another set of memory cells (including the memory cell 924) connected to the one word line (WLL0) are also at the particular height. In another approach, another set of memory cells (e.g., including the memory cell 912) connected to another word line (e.g., WLL8) are at another height (z8) in the stack.

FIG. 9B illustrates another example view of NAND strings in sub-blocks. The NAND strings include NS0_SBa, NS1_SBb, NS2_SBc, NS3_SBd, and NS4_SBe which have 48 word lines (e.g., WL0-WL47). Each sub-block comprises NAND string groups which extend in the x direction and which have a common SGD line, e.g., SGD0, SGD1, SGD2, SGD3, or SGD4. In this simplified example, there is only one SGD transistor and one SGS transistor in each NAND string. The NAND strings NS0_SBa, NS1_SBb, NS2_SBc, NS3_SBd, and NS4_SBe are in sub-blocks SBa, SBb, SBc, SBd, and SBe, respectively. Further, example, groups of word lines G0, G1 and G2 are illustrated.

FIG. 10 illustrates a waveform of an example programming operation. The horizontal axis illustrates program loop numbers and the vertical axis illustrates program voltage values and program verify values. A program voltage (Vpgm) may include a word line voltage (WLVpgm) and/or a bit line voltage (BLVpgm). Generally, a programming operation may involve applying a pulse train to a selected word line, where the pulse train includes multiple program-verify (PV) iterations. The program portion of a PV iteration comprises the program voltage and the verify portion of the PV iteration comprises one or more verify voltages.

For each program voltage, a square waveform is illustrated for simplicity, although other shapes are possible such as a multilevel shape or a ramped shape. Further, Incremental Step Pulse Programming (ISPP) is used in this example, in which the program voltage steps up in each successive program loop. This example uses ISPP in a single programming step in which the programming is completed. ISPP can also be used in each programming step of a multistep operation.

A pulse train typically includes program voltages which increase stepwise in amplitude in each program-verify iteration using a voltage bias (dVpgm). The voltage bias may, for example, be a word line voltage bias. A new pulse train may be applied in each programming step of a multistep program-verify operation, starting at an initial program voltage (e.g., an initial Vpgm) and ending at a final program voltage (e.g., a final Vpgm) which does not exceed a threshold voltage Vth (e.g., a maximum allowed value). The initial program voltages can be the same or different in different programming steps. The final program voltages can also be the same or different in different programming steps. The voltage biases may be the same or different in the different programming steps. In some cases, a smaller voltage bias is used in a final programming step to reduce Vth distribution widths.

The pulse train 1000 includes a series of program voltages 1001, 1002, 1003, 1004, 1005, 1006, 1007, 1008, 1009, 1010, 1011, 1012, 1013, 1014, and 1015 that are applied to a word line selected for programming, and an associated set of non-volatile memory cells. In the example shown, one, two, or three verify voltages are provided after each program voltage, for example, based on a number of target data states which are being verified. The number of target data states being verified may, for example, correspond to a number of memory cells associated with the word line. A program voltage and corresponding verify voltage can be separated by applying 0 V to the selected word line between the program voltage and the verify voltage.

In the example shown, an A-state verify voltage of VvA (e.g., waveform or programming signal 1016) may be applied after each of the first, second, and third program voltages 1001, 1002, and 1003, respectively. A- and B-state verify voltages of VvA and VvB (e.g., programming signal 1017) may be applied after each of the fourth, fifth and sixth program voltages 1004, 1005 and 1006, respectively. A-, B- and C-state verify voltages of VvA, VvB, and VvC (e.g., programming signal 1018) may be applied after each of the seventh and eighth program voltages 1007 and 1008, respectively. B- and C-state verify voltages of VvB and VvC (e.g., programming signal 1019) may be applied after each of the ninth, tenth and eleventh program voltages 1009, 1010, and 1011, respectively. Finally, a C-state verify voltage of VvC (e.g., programming signal 1020) may be applied after each of the twelfth, thirteenth, fourteenth and fifteenth program voltages 1012, 1013, 1014, and 1015, respectively.

In some embodiments, the memory device 100 (e.g., using the state machine 112 of the control circuitry 110, the controller 122, and/or the control circuit 150) may use different program voltages and/or different program voltage biases to perform the programming operation. In some embodiments, a program voltage and a program voltage bias used to perform the programming operation may include a word line voltage and a word line voltage bias, respectively. Additionally, or alternatively, the program voltage and the program voltage bias used to perform the programming operation may include a bit line voltage and a bit line voltage bias, respectively.

In some embodiments, a program voltage and/or a program voltage bias that is to be applied to a line (e.g., a bit line, a word line, etc.) connecting to a memory cell may be identified based on a position of the memory cell within the memory architecture. The position of the memory cell may be indicative of the memory cell being included in a particular NAND string group, indicative of the memory cell being included on a particular plane of the memory architecture, and/or the like. Additionally, or alternatively, the program voltage bias may be identified based on a thickness of contact line connectors that segment or separate a particular NAND string group (e.g., that the memory cell is included in) from other NAND string groups. Additional information is provided in connection with FIGS. 11-13.

Figure 11:
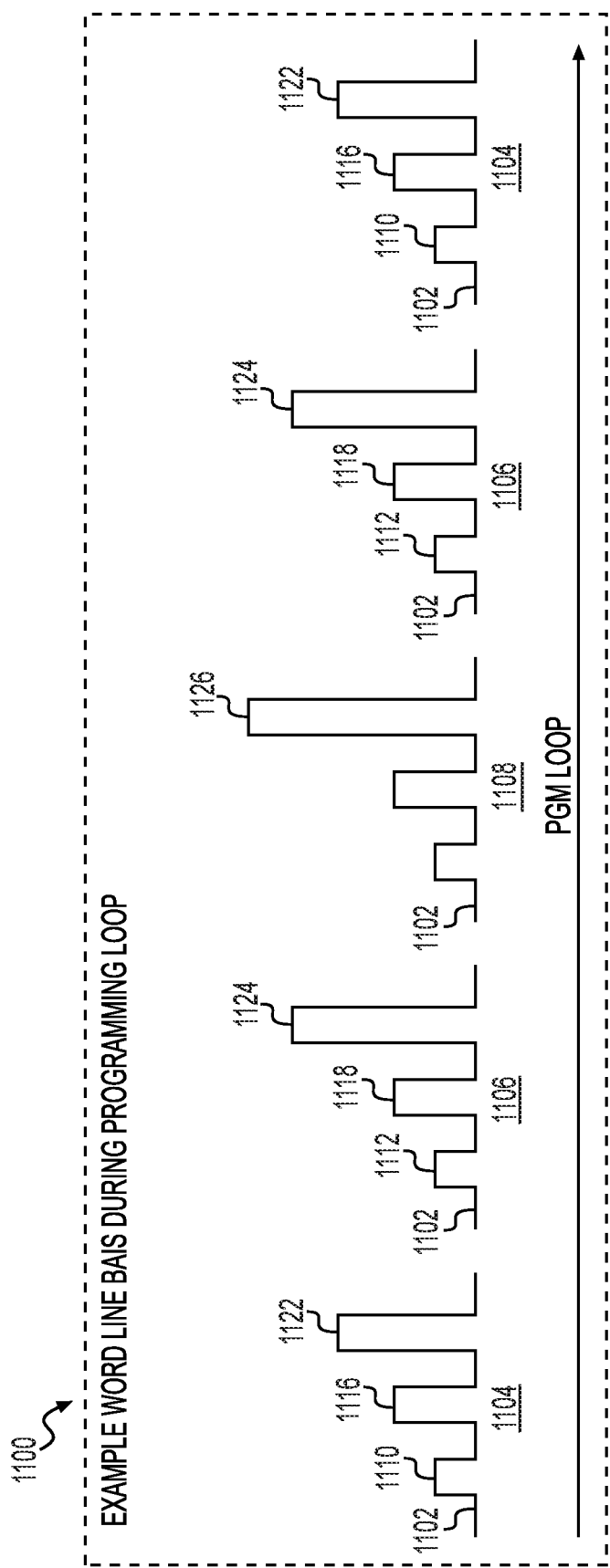
FIG. 11 illustrates schematically an application of word line voltages during a programming operation.

FIG. 11 illustrates schematically an application of word line voltages (default, biased, etc.) during a programming operation. The 3-D memory architecture illustrated in FIG. 9B will be referenced to provide a specific example of selecting and applying the word line voltages. FIG. 9B shows a block as having five sub-blocks (SBa, SBb, SBc, SBd, and SBe) that include at least five NAND string groups (NS0_SBa, NS1_SBb, NS2_SBc, NS3_SBd, and NS4_SBe) that connect to bit lines BL0-BL4, which run across the top portion of the sub-blocks.

As shown, to perform various iterations of the programming operation, the memory device 100 may identify a default word line voltage 1102 (WLVpgmu). The memory device 100 may also identify a word line voltage bias 1104, a word line voltage bias 1106, and a word line voltage bias 1108 that may be used to iteratively increase the default word line voltage 1102 that is to be applied to various word lines during each iteration of the program operation. The memory device 100 may identify the word line voltage bias 1104 to be used for programming a first set of memory cells included in outer NAND string NS0_SBa or outer NAND string NS4_SBe.

The word line voltage bias 1104 may be identified based on respective memory cells, of the first set of memory cells, being positioned in outer NAND string NS0_SBa or outer NAND string NS4_SBe.

The memory device 100 may identify a word line voltage bias 1106 to be used for programming a second set of memory cells included in inner NAND string NS1_SBb and inner NAND string NS3_SBd. The memory device 100 may identify the word line voltage bias 1106 to be used for programming a second set of memory cells included in inner NAND string NS1_SBb or inner NAND string NS3_SBd. The word line voltage bias 1106 may be identified based on respective memory cells, of the second set of memory cells, being positioned in inner NAND string NS1_SBb or inner NAND string NS3_SBd.

The memory device 100 may identify a word line voltage bias 1108 to be used for programming a third set of memory cells included in inner-most NAND string NS2_SBc. The memory device 100 may identify the word line voltage bias 1108 to be used for programming a third set of memory cells included in inner-most NAND string NS2_SBc. The word line voltage bias 1108 may be identified based on respective memory cells, of the third set of memory cells, being positioned in inner-most NAND string NS2_SBc. The word line voltage bias 1108 may have a voltage value that is greater than word line voltage bias 1106 and word line voltage bias 1106. The word line voltage bias 1106 may have a voltage value that is greater than word line voltage bias 1104.

The memory device 100 may, for a first iteration of the programming operation, apply the default word line voltage 1102 to one or more selected word lines (e.g., word line WL0, word line WL1, . . . , word line WL47, etc.). The memory device 100 may, for a second iteration of the programming operation, determine a next-iteration biased word line voltage 1110 to use for programming the first set of memory cells. The determination may be made by increasing the default word line voltage 1102 using the word line voltage bias 1104. The memory device 100 may apply the next-iteration biased word line voltage 1110 to a first subset of word lines connecting to the first set of memory cells. Thus, when the first set of memory cells are selected for programming, each memory cell will receive the next-iteration biased word line voltage 1110 that has been biased using the bit line voltage bias 1104.

The memory device 100 may, for the second iteration of the programming operation, determine a next-iteration biased word line voltage 1112 to use for programming the second set of memory cells. The determination may be made by increasing the default word line voltage 1102 by the word line voltage bias 1106. The memory device 100 may apply the next-iteration biased word line voltage 1112 to a second subset of word lines connecting to the second set of memory cells. Thus, when the second set of memory cells are selected for programming, each memory cell will receive the next-iteration biased word line voltage 1112 that has been biased using the bit line voltage bias 1106.

The memory device 100 may, for the second iteration of the programming operation, determine a next-iteration biased word line voltage 1114 to use for programming the third set of memory cells. The determination may be made by increasing the default word line voltage 1102 by the word line voltage bias 1108. The memory device 100 may apply the next-iteration biased word line voltage 1114 to a third subset of word lines connecting to the third set of memory cells. Thus, when the third set of memory cells are selected for programming, each memory cell will receive the next-iteration biased word line voltage 1114 that has been biased using the bit line voltage bias 1108.

The memory device 100 may, for a third iteration of the programming operation, determine a next-iteration biased word line voltage 1116 to use for programming the first set of memory cells. The determination may be made by increasing the next-iteration biased word line voltage 1110 by the word line voltage bias 1104. The memory device 100 may apply the next-iteration biased word line voltage 1116 to the first subset of word lines connecting to the first set of memory cells. Thus, when the first set of memory cells are selected for programming, each memory cell will receive the next-iteration biased word line voltage 1116 that has been biased using the bit line voltage bias 1104.

The memory device 100 may, for the third iteration of the programming operation, determine a next-iteration biased word line voltage 1118 to use for programming the second set of memory cells. The determination may be made by increasing the next-iteration biased word line voltage 1112 by the word line voltage bias 1106. The memory device 100 may apply the next-iteration biased word line voltage 1118 to the second subset of word lines connecting to the second set of memory cells. Thus, when the second set of memory cells are selected for programming, each memory cell will receive the next-iteration biased word line voltage 1118 that has been biased using the bit line voltage bias 1106.

The memory device 100 may, for the third iteration of the programming operation, determine a next-iteration biased word line voltage 1120 to use for programming the third set of memory cells. The determination may be made by increasing the next-iteration biased word line voltage 1114 by the word line voltage bias 1108. The memory device 100 may apply the next-iteration biased word line voltage 1114 to the third subset of word lines connecting to the third set of memory cells. Thus, when the second set of memory cells are selected for programming, each memory cell will receive the next-iteration biased word line voltage 1120 that has been biased using the bit line voltage bias 1108.

The memory device 100 may, for a fourth iteration of the programming operation, determine a next-iteration biased word line voltage 1122 to use for programming the first set of memory cells. The determination may be made by increasing the next-iteration biased word line voltage 1116 by the word line voltage bias 1104. The memory device 100 may apply the next-iteration biased word line voltage 1122 to the first subset of word lines connecting to the first set of memory cells. Thus, when the second set of memory cells are selected for programming, each memory cell will receive the next-iteration biased word line voltage 1122 that has been biased using the bit line voltage bias 1104.

The memory device 100 may, for the fourth iteration of the programming operation, determine a next-iteration biased word line voltage 1124 to use for programming the second set of memory cells. The determination may be made by increasing the next-iteration biased word line voltage 1118 by the word line voltage bias 1106. The memory device 100 may apply the next-iteration biased word line voltage 1124 to the second subset of word lines connecting to the second set of memory cells. Thus, when the second set of memory cells are selected for programming, each memory cell will receive the next-iteration biased word line voltage 1124 that has been biased using the bit line voltage bias 1106.

The memory device 100 may, for the fourth iteration of the programming operation, determine a next-iteration biased word line voltage 1126 to use for programming the third set of memory cells. The determination may be made by increasing the next-iteration biased word line voltage 1120 by the word line voltage bias 1108. The memory device 100 may apply the next-iteration biased word line voltage 1126 to the third subset of word lines connecting to the third set of memory cells. Thus, when the second set of memory cells are selected for programming, each memory cell will receive the next-iteration biased word line voltage 1126 that has been biased using the bit line voltage bias 1108.

The programming operation may complete in a manner described elsewhere herein (e.g., such as when biased word line program voltages satisfy a program voltage threshold and corresponding biased word line verify voltages satisfy a verify voltage threshold).

While the example in FIG. 11 only illustrates four iterations of the programming operation, it is to be understood that this is provided only by way of example, and that in practice, the programming operation may continue until a stop condition is satisfied. Furthermore, while determination of biased word line voltages has been described has part of the programming operation, in other embodiments, the determination may be performed as a pre-step that occurs prior to performance of the programming operation.

By applying different biased word line voltages to word lines corresponding to memory cells in different NAND string groups, a total time to program the memory cells in each respective NAND string group becomes more evenly distributed. This conserves resources (e.g., processing resources, memory resources, energy resources, and/or the like) by reducing a total number of iterations to complete the program operation and a total number of corresponding iterations to complete a program verify operation.

Figure 12:
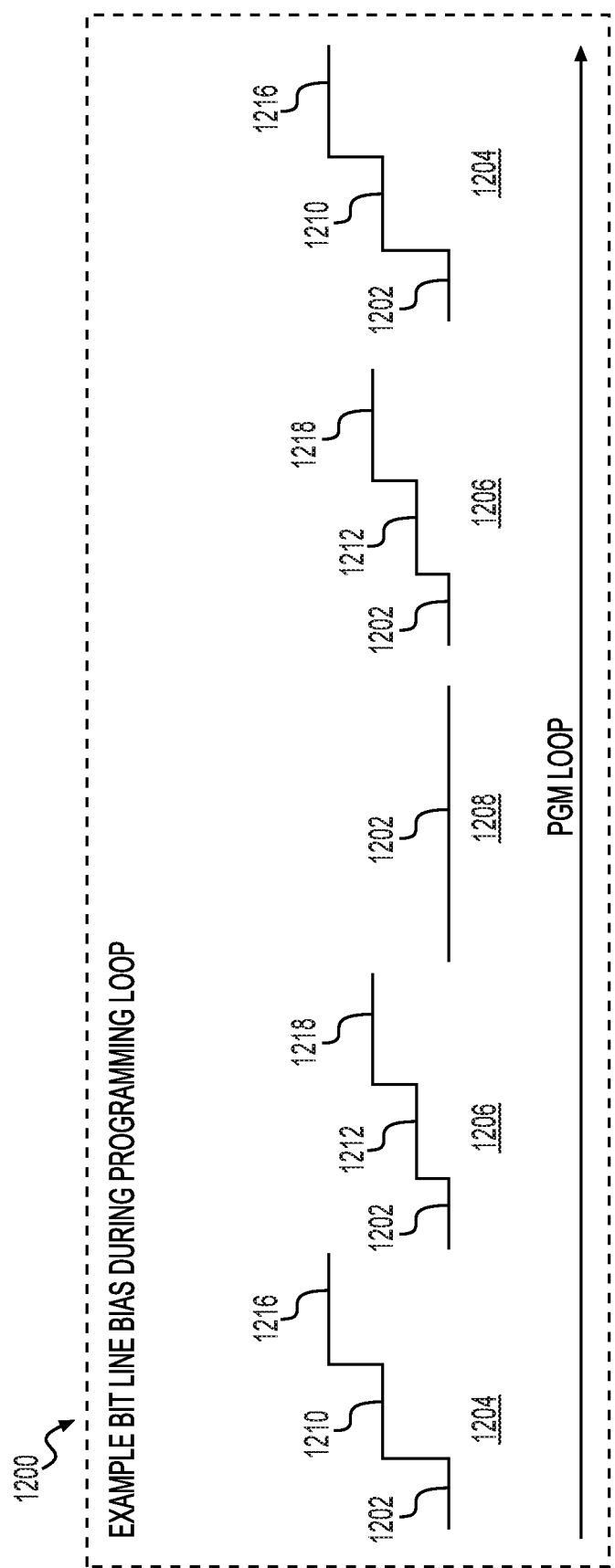
FIG. 12 illustrates schematically an application of bit line voltages during a programming operation.

FIG. 12 illustrates schematically an application of bit line voltages (default, biased, etc.) during a programming operation. For example, rather than utilizing different word line voltage biases when performing the programming operation, the memory device 100 may apply bit line voltages (e.g., program enable voltages, which may be default voltages or biased voltages) to bit lines (e.g., bit line BL0, bit line BL1, bit line BL2, and bit line BL3) corresponding to selected word lines and one or more NAND string groups that share the same plane.

The 3-D memory architecture illustrated in FIG. 9B will be referenced to provide a specific example of selecting and applying the bit line voltages. For example, the memory device 100 may be configured to identify a default bit line voltage 1202 that may be used to iteratively increase the default bit line voltage 1202 that is to be applied to various bit lines during each iteration of the programming operation. The default bit line voltage value 1202 may have a neutral voltage value (zero volts) or may be a negative voltage value. Non-selected or verified memory cells may be provided with a program inhibit voltage sufficient to turn off a drain side select gate. The program inhibit voltage may have a positive voltage value.

As shown, the memory device 100 may identify a bit line voltage bias 1204, a bit line voltage bias 1206, and a bit line voltage bias 1208 that may be used to iteratively increase the default word line voltage 1202 that is to be applied to various word lines during each iteration of the program operation. For example, the memory device 100 may identify the bit line voltage bias 1204 to be used for programming a first set of memory cells that are included in outer NAND string NS0_SBa or outer NAND string NS4_SBe and that are connected with a first subset of bit lines. The bit line voltage bias 1204 may be identified based on the first set of memory cells being positioned in outer NAND string NS0_SBa or outer NAND string NS4_SBe.

The memory device 100 may identify a bit line voltage bias 1206 to be used for programming a second set of memory cells that are included in inner NAND string NS1_SBb or inner NAND string NS3_SBd and that are connected with a second subset of bit lines. The bit line voltage bias 1206 may be identified based on the second set of memory cells being positioned in inner NAND string NS1_SBb or inner NAND string NS3_SBd.

The memory device 100 may identify a bit line voltage bias 1208 to be used for programming a third set of memory cells that are included in inner-most NAND string NS2_SBc and that are connected with a third subset of bit lines. The bit line voltage bias 1208 may be identified based on the third set of memory cells being positioned in inner-most NAND string NS2_SBc.

The memory device 100 may, for a second iteration of the programming operation, determine a next-iteration biased bit line voltage 1210 to use for programming the first set of memory cells. The determination may be made by decreasing the default bit line voltage 1202 using the bit line voltage bias 1204. The next-iteration biased bit line voltage 1210 may have a negative bias (e.g., −1V, −2V, etc.). The memory device 100 may apply the next-iteration bit line voltage 1210 to the first subset of bit lines connecting to the first set of memory cells. Thus, when the first subset of memory cells are selected for programming, each memory cell will receive a word line voltage. In this case, selected memory cells will receive a word line voltage that will be offset by the next-iteration bit line voltage 1210 (e.g., because the next-iteration bit line voltage 1210 has a negative voltage value).

The memory device 100 may, for the second iteration of the programming operation, determine a next-iteration biased bit line voltage 1212 to use for programming the second set of memory cells. The determination may be made by decreasing the default bit line voltage 1202 using the bit line voltage bias 1206. The next-iteration biased bit line voltage 1212 may have a negative bias (e.g., −1V, −2V, etc.). The next-iteration biased bit line voltage 1210 may have a greater negative voltage (lower numerical value) than the biased bit line voltage 1212. The memory device 100 may apply the next-iteration bit line voltage 1212 to the second subset of bit lines connecting to the second set of memory cells. Thus, when the second subset of memory cells are selected for programming, each memory cell will receive a word line voltage. In this case, selected memory cells will receive a word line voltage that will be offset by the next-iteration bit line voltage 1212 (e.g., because the next-iteration bit line voltage 1212 has a negative voltage value).

The memory device 100 may, for the second iteration of the programming operation, determine a next-iteration biased bit line voltage 1214 to use for programming the third set of memory cells. Because the third set of memory cells are positioned in the inner-most NAND string group NS2_SBc, the next-iteration biased bit line voltage 1214 to be used for programming the third set of memory cells may be the default bit line voltage 1202 (or a voltage equal to the default bit line voltage 1202). The memory device 100 may apply the next-iteration bit line voltage 1214 (i.e., the default bit line voltage 1202) to the third subset of bit lines connecting to the third set of memory cells. Thus, when the third subset of memory cells are selected for programming, each memory cell will receive a word line voltage. In this case, selected memory cells will receive a word line voltage that will not be offset by the next-iteration bit line voltage 1214 (e.g., because the next-iteration bit line voltage 1214 has a neutral voltage value of zero volts).

The memory device 100 may, for a third iteration of the programming operation, determine a next-iteration biased bit line voltage 1216 to use for programming the first set of memory cells. The determination may be made by decreasing the next-iteration bit line voltage 1210 using the bit line voltage bias 1204. The memory device 100 may apply the next-iteration bit line voltage 1216 to the first subset of bit lines. For example, when the first subset of memory cells are selected for programming, each memory cell will receive a word line voltage. In this case, selected memory cells will receive a word line voltage that will be offset by the next-iteration bit line voltage 1216 (e.g., because the next-iteration bit line voltage 1216 has a negative voltage value).

The memory device 100 may, for the third iteration of the programming operation, determine a next-iteration biased bit line voltage 1218 to use for programming the second set of memory cells. The determination may be made by decreasing the next-iteration bit line voltage 1212 using the bit line voltage bias 1206. The next-iteration biased bit line voltage 1216 may have a greater negative voltage (lower numerical value) than the next-iteration biased bit line voltage 1218. The memory device 100 may apply the next-iteration bit line voltage 1218 to the second subset of bit lines. For example, when the second subset of memory cells are selected for programming, each memory cell will receive a word line voltage. In this case, selected memory cells will receive a word line voltage that will be offset by the next-iteration bit line voltage 1218 (e.g., because the next-iteration bit line voltage 1218 has a negative voltage value).

The memory device 100 may, for the third iteration of the programming operation, determine a next-iteration biased bit line voltage 1220 to use for programming the third set of memory cells. Because the third set of memory cells are positioned in the inner-most NAND string group NS2_SBc, the next-iteration biased bit line voltage 1220 to be used for programming the third set of memory cells may be the default bit line voltage 1202 (or a voltage equal to the default bit line voltage 1202). The memory device 100 may apply the next-iteration bit line voltage 1220 (i.e., the default bit line voltage 1202) to the third subset of bit lines. For example, when the third subset of memory cells are selected for programming, each memory cell will receive a word line voltage. In this case, selected memory cells will receive a word line voltage that will not be offset by the next-iteration bit line voltage 1220 (e.g., because the next-iteration bit line voltage 1220 has a neutral voltage value of zero volts).

The programming operation may complete in a manner described elsewhere herein (e.g., such as when biased word line program voltages satisfy a program voltage threshold and corresponding biased word line verify voltages satisfy a verify voltage threshold).

While the example in FIG. 12 illustrates only three iterations of the programming operation, it is to be understood that this is provided only by way of example, and that in practice, iterations may continue until a stop condition is satisfied.

By applying different bit line voltages to memory cells in different NAND string groups, a total time to program the memory cells in each respective NAND string group becomes more evenly distributed. This conserves resources (e.g., processing resources, memory resources, energy resources, and/or the like) by reducing a total number of iterations to complete the program operation and a total number of corresponding iterations to complete a program verify operation.

Figure 13:
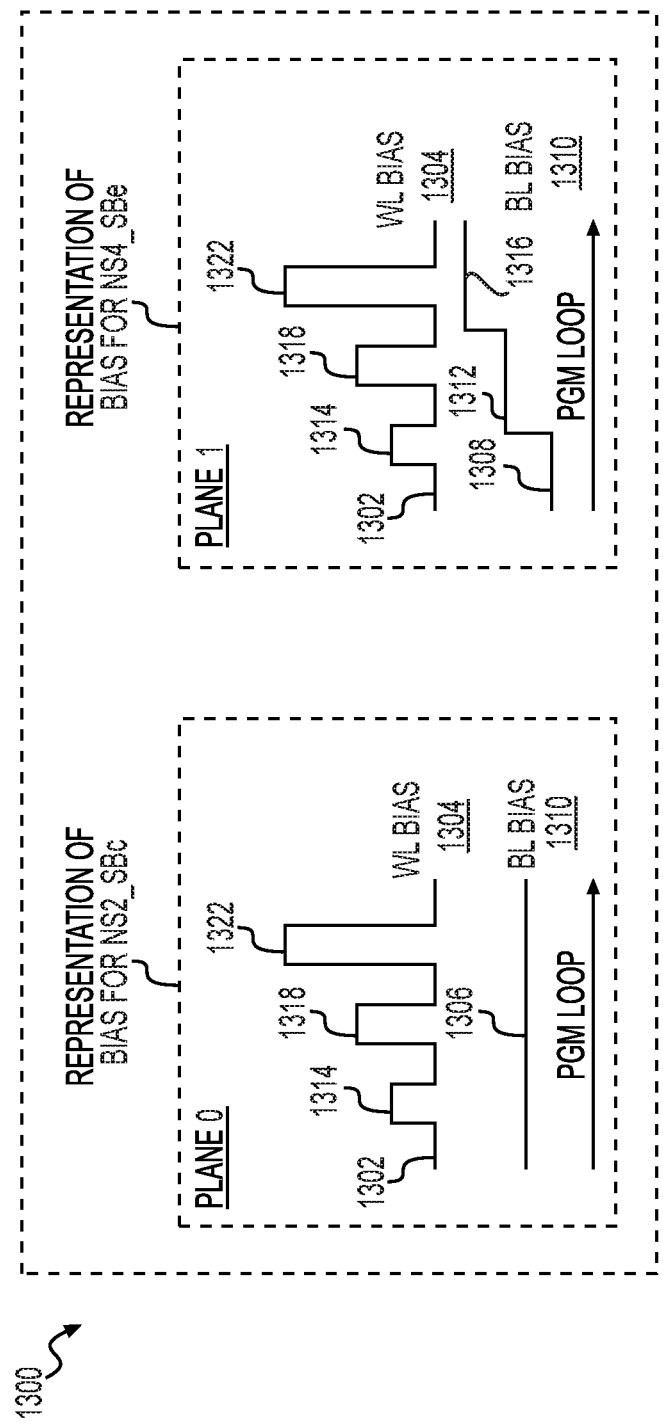
FIG. 13 illustrates schematically an application of word line voltages and bit line voltages during a programming operation.

FIG. 13 illustrates schematically an application of word line voltages (default, biased, etc.) and bit line voltages (default, biased, etc.) during a programming operation. For example, in some situations, a programming operation may be performed on memory cells that are included in different NAND string groups and that are on separate planes. In this case, different word line voltage biases cannot be used to iteratively increase the default word line voltage on separate planes because of a shared word line voltage signal (e.g., one pump generates the signal and is shared across multiple planes). To address this, a hybrid approach is applied that utilizes a combination of word line voltages and bit line voltages, as further described below.

The 3-D memory architecture illustrated in FIG. 9B will be referenced to provide a specific example of identifying and applying word line voltages and bit line voltages during the programming operation. The 3-D memory architecture may include a set of memory cells that are positioned within NAND string groups and on multiple planes. The set of memory cells may include a first subset of memory cells that are positioned within an inner-most NAND string group and on a first plane (shown as a representation of bias for NS2_SBc on plane 0), a second subset of memory cells that are positioned within an outer NAND string group and on a second plane (shown as a representation of bias for NS4_SBe on plane 1). While one or more embodiments refer to memory cells in the inner-most NAND string group and an outer NAND string group, it is to be understood that this is provided by way of example. In practice, the one or more embodiments can be implemented on any number of combinations of NAND string groups and planes.

A default word line voltage 1302 may be used during a first iteration of the programming operation. The memory device 100 may identify a constant word line voltage bias 1304 and a constant default bit line voltage 1306 for programming the first subset of memory cells. The memory device 100 may identify the constant word line voltage bias 1304, a default bit line voltage 1308, and a bit line voltage bias 1310 for programming the second subset of memory cells. The memory device 100 may have identified each respective programming voltage based on identifying that the set of memory cells include memory cells in multiple NAND string groups and on multiple planes.

The memory device 100 may, for a first iteration of the programming operation, apply the constant default bit line voltage 1306 to bit lines corresponding to the first subset of memory cells and apply the default bit line voltage 1308 to bit lines corresponding to the second subset of memory cells. The memory device 100 may then apply the default word line voltage 1302 to word lines corresponding to the first and second subsets of memory cells, respectively.

The memory device 100 may, for a second iteration of the programming operation, determine a next-iteration biased bit line voltage 1312 for the bit lines corresponding to the second subset of memory cells. The determination may be made by decreasing the default bit line voltage 1308 using the bit line voltage bias 1310. The memory device 100 may determine a next-iteration biased word line voltage 1314 for word lines corresponding to the first and second subset of memory cells. The determination may be made by increasing the default word line voltage 1302 using the word line voltage bias 1304. The memory device 100 may apply the next-iteration biased bit line voltage 1312 to the bit lines corresponding to the second subset of memory cells. When the second subset of memory cells are selected for programming, the next-iteration biased word line voltage 1314 may be applied to word lines and may pulsate toward each corresponding memory cell. In this case, selected memory cells in the first set of memory cells will receive a modified next-iteration biased word line voltage 1314 that has been offset by the default bit line voltage 1306. Selected memory cells in the second set of memory cells will receive a modified (e.g., lower) next-iteration biased word line voltage 1314 (e.g., because the next-iteration bit line voltage 1312 had a negative voltage value).

The memory device 100 may, for a third iteration of the programming operation, determine a next-iteration biased bit line voltage 1316 for the bit lines corresponding to the second subset of memory cells. The determination may be made by decreasing the next-iteration bit line voltage 1312 using the bit line voltage bias 1310. The memory device 100 may determine a next-iteration biased word line voltage 1318 for word lines corresponding to the first and second subset of memory cells. The determination may be made by increasing the next-iteration word line voltage 1314 using the word line voltage bias 1304. The memory device 100 may apply the next-iteration biased bit line voltage 1316 to the bit lines corresponding to the second subset of memory cells. When the second subset of memory cells are selected for programming, the next-iteration biased word line voltage 1318 may be applied to word lines and may pulsate toward each corresponding memory cell. In this case, selected memory cells in the first set of memory cells will receive a modified next-iteration biased word line voltage 1318 that has been offset by the default bit line voltage 1306. Selected memory cells in the second set of memory cells will receive a modified (e.g., lower) next-iteration biased word line voltage 1318 (e.g., because the next-iteration bit line voltage 1316 had a negative voltage value).

The memory device 100 may, for a fourth iteration of the programming operation, determine a next-iteration biased bit line voltage 1320 for the bit lines corresponding to the second subset of memory cells. The determination may be made by decreasing the next-iteration bit line voltage 1316 using the bit line voltage bias 1310. The memory device 100 may determine a next-iteration biased word line voltage 1322 for word lines corresponding to the first and second subset of memory cells. The determination may be made by increasing the next-iteration word line voltage 1318 using the word line voltage bias 1304. The memory device 100 may apply the next-iteration biased bit line voltage 1320 to the bit lines corresponding to the second subset of memory cells. When the second subset of memory cells are selected for programming, the next-iteration biased word line voltage 1322 may be applied to word lines and may pulsate toward each corresponding memory cell. In this case, selected memory cells in the first set of memory cells will receive a modified next-iteration biased word line voltage 1322 that has been offset by the default bit line voltage 1306. Selected memory cells in the second set of memory cells will receive a modified (e.g., lower) next-iteration biased word line voltage 13220 (e.g., because the next-iteration bit line voltage 1320 had a negative voltage value).

The programming operation may complete in a manner described elsewhere herein (e.g., such as when biased word line program voltages satisfy a program voltage threshold and corresponding biased word line verify voltages satisfy a verify voltage threshold). While the example in FIG. 13 illustrates only four iterations of the programming operation, it is to be understood that this is provided only by way of example, and that in practice, iterations may continue until a stop condition is satisfied.

By identifying the constant word line voltage bias 1304, the memory device 100 ensures that the same word line voltage bias is used on each plane (e.g., due to the shared signal). By identifying the constant default bit line voltage 1306 for the first subset of memory cells corresponding to the inner-most NAND string group and the bit line voltage bias 1310 for the second subset of memory cells corresponding to the outer-most NAND string group, the identified voltage values are able to offset a programming delay caused by a discrepancy in thickness of contact line connectors between the two NAND string groups.

Figure 14:
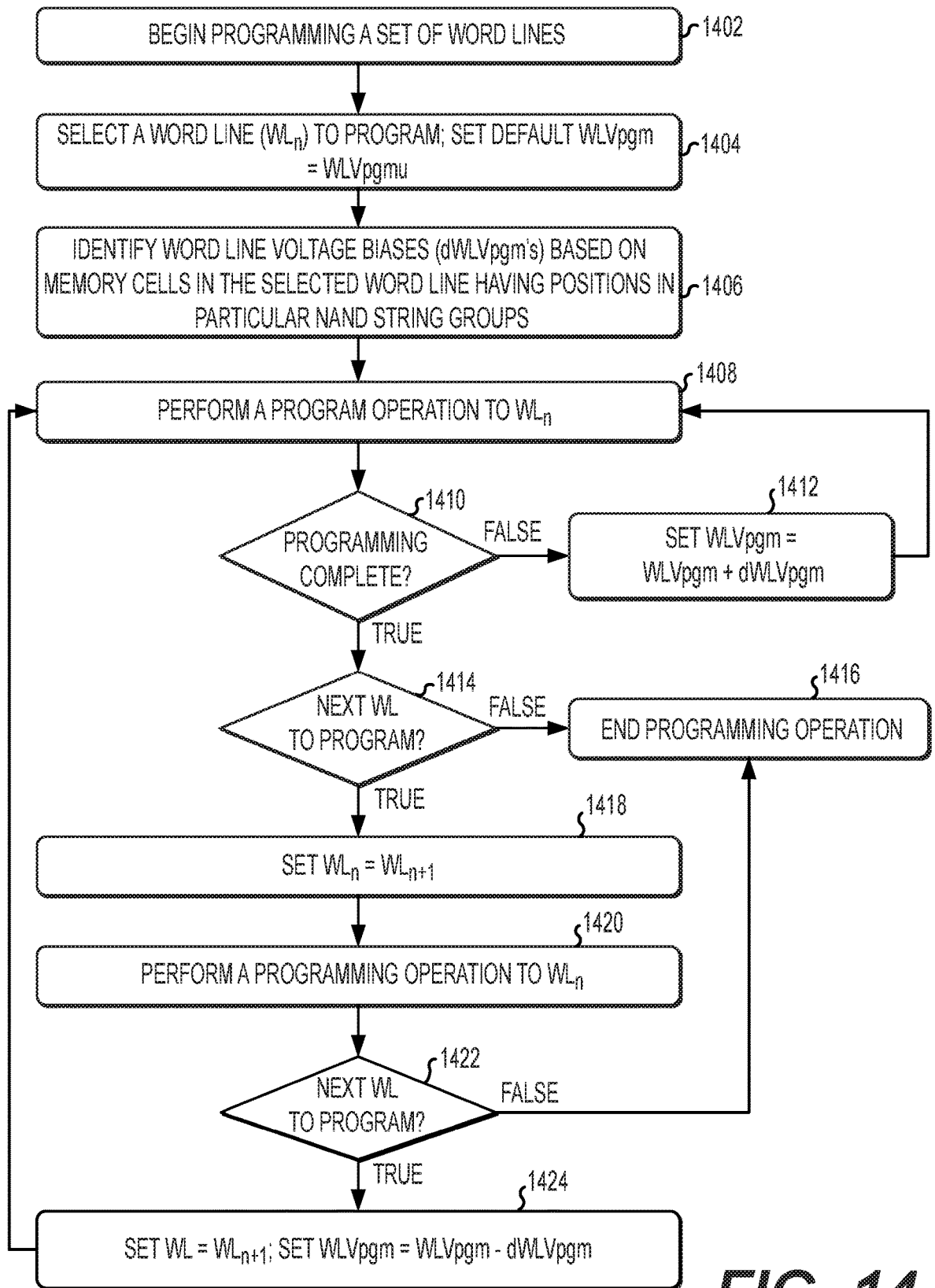
FIG. 14 is a flow diagram illustrating a method for programming a set of memory cells corresponding to NAND string groups using different word line voltages for subsets of memory cells included in respective NAND string groups, according to the principles of the present disclosure.

FIG. 14 is a flowchart of an example programming operation in a memory device. Step 1402 begins a programming operation for a set of word lines or for at least one word line. Step 1404 selects a word line to program (e.g., word line [$WL_n$]) and sets a word line voltage (WLVpgm) to a predetermined initial program voltage (WLVpgmu). In one example, WLVpgmu is fourteen Volts (14 V).

Step 1406 identifies word line voltage biases (dWLVpgm's) based on memory cells in the selected word line having positions that correspond to particular NAND string groups. For example, a set of available word line voltage biases may be identifiable for use during the programming operation. A word line voltage bias may be identified from the set based on memory cells in the word line having positions that correspond to a particular NAND string group. A word line voltage bias may be identified for subsets of memory cells positioned in each respective NAND string group.

Step 1408 performs a program iteration which includes applying WLVpgm to all of the cells coupled to $WL_n$ in a programming operation. Decision step 1410 determines if programming of the word line is done, e.g., based on the results of a verify operation. The programming may be done, for example, if all or nearly all of the cells of the word line have been programmed to their assigned data state, i.e., the data state they were assigned to represent. If decision step 1410 is false, then at step 1412, WLVpgm is incrementally increased (i.e., stepped up) by a voltage step by the identified dWLVpgm, i.e., WLVpgm is set to WLVpgm+dWLVpgm. In one example, dWLVpgm is one half of a Volt (0.5 V). Next, the programming operation returns to step 1408 to conduct the next program iteration. Each repetition of step 1408 until decision step 1410 is true is one program loop, which requires resources from the controller.

If decision step 1410 is true (the program operation to $WL_n$ was successful), a decision step 1414 determines if there is a next word line to program. If decision step 1414 is false (there are no additional word lines to program), then the programming operation ends at step 1416. If decision step 1414 is true, then at step 1418, $WL_n$ is incrementally advanced to the next word line to be programmed, i.e., $WL_n$ is set to $WL_{n+1}$.

Step 1420 performs a programming operation which includes applying WLVpgm to $WL_n$. The WLVpgm which is applied at step 1420 is the WLVpgm which ultimately was successful at step 1408, and thus, WLVpgm at step 1420 may be equal to or greater than WLVpgmu.

Decision step 1422 determines if there is a next word line to program. If decision step 1422 is false (there are no additional word lines to program), then the programming operation ends at step 1416. If decision step 1422 is true, then at step 1424, $WL_n$ is incrementally advanced to the next word line to be programmed ($WL_n$ is set to $WL_{n+1}$) and WLVpgm is incrementally decreased (stepped down) by dWLVpgm (WLVpgm is set to WLVpgm-dWLVpgm). The programming operation then returns to the program operation at step 1408.

In the above example, the cumulative number of program loops (and corresponding verify loops) which must be completed to successfully program the set of word lines is reduced relative to other known programming operations which are unable to identify word line voltage based on memory cells respective word lines having positions that correspond to particular NAND string groups. In other words, the programming operation optimizes the time to acquire the optimal programming voltages. Thus, the overall performance and the endurance of the memory device are both improved.

Figure 15:
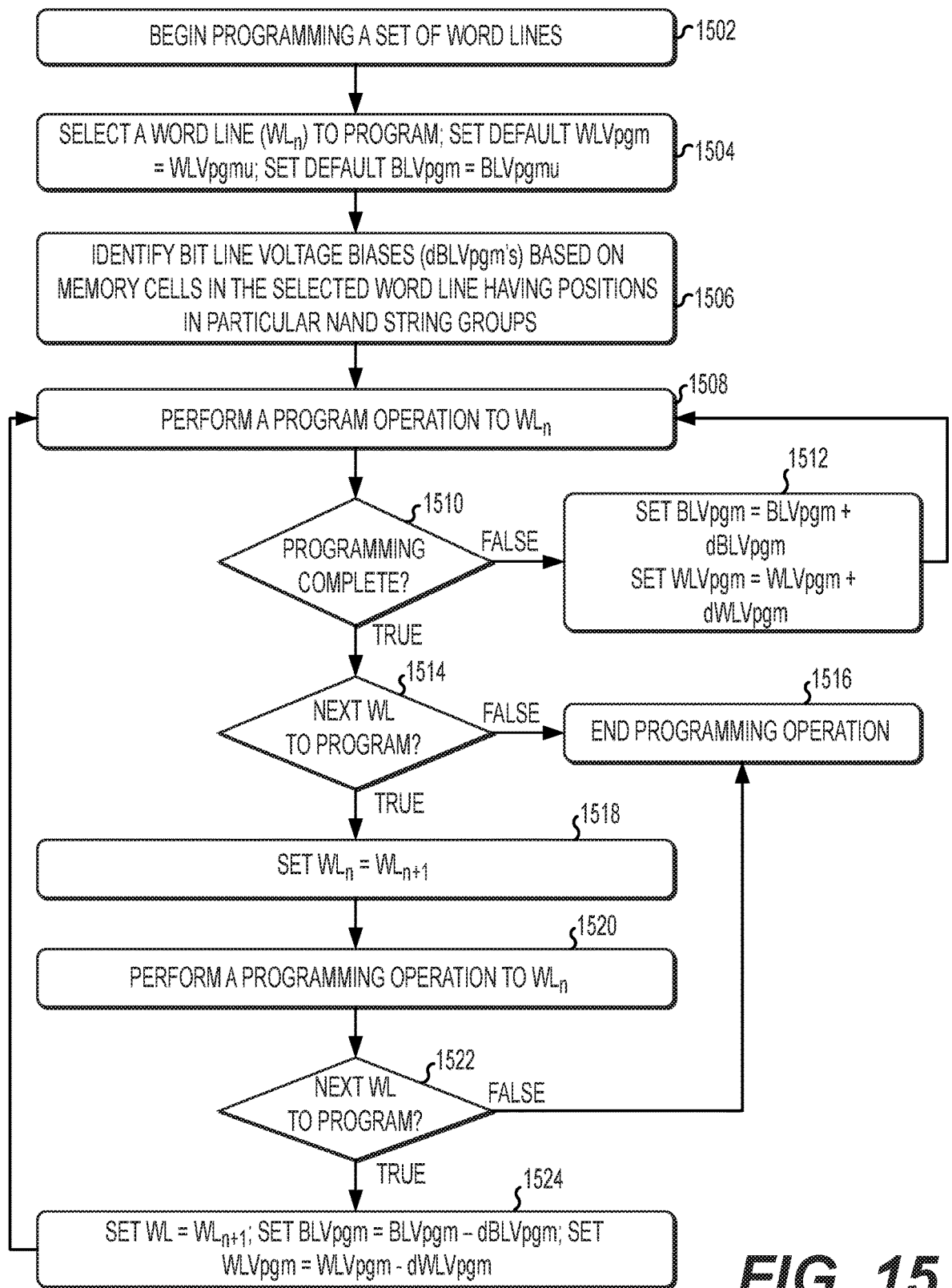
FIG. 15 is a flow diagram illustrating a method for programming a set of memory cells corresponding to NAND string groups using different bit line voltages for subsets of memory cells included in respective NAND string groups, according to the principles of the present disclosure.

FIG. 15 is a flowchart of an example programming operation in a memory device. Step 1502 begins a programming operation for a set of word lines or for at least one word line. Step 1504 selects a word line to program (e.g., word line [$WL_n$]) and sets a word line voltage (WLVpgm) to a predetermined initial program voltage (WLVpgmu). In one example, WLVpgmu is fourteen Volts (14 V). The selected word line may correspond to a set of bit lines.

Step 1506 identifies bit line voltage biases (dBLVpgm's) based on memory cells in the selected word line having positions that correspond to particular NAND string groups. For example, a set of available bit line voltage biases may be identifiable for use during the programming operation. A bit line voltage bias may be identified for subsets of memory cells positioned in each respective NAND string group.

Step 1508 performs a program iteration which includes applying the BLVpgm's to the set of bit lines and applying WLVpgm to all of the cells coupled to $WL_n$. Decision step 1510 determines if programming of the word line is done, e.g., based on the results of a verify operation. The programming may be done, for example, if all or nearly all of the cells of the word line have been programmed to their assigned data state, i.e., the data state they were assigned to represent. If decision step 1510 is false, then at step 1512, WLVpgm is incrementally increased (i.e., stepped up) by a voltage step of a default amount, i.e., WLVpgm is set to WLVpgm+dWLVpgm, and BLVpgm is incrementally decreased (i.e., stepped down) by the identified dBLVpgm. In one example, dWLVpgm is one half of a Volt (0.5 V). Next, the programming operation returns to step 1508 to conduct the next program iteration. Each repetition of step 1508 until decision step 1510 is true is one program loop, which requires resources from the controller.

If decision step 1510 is true (the program operation to $WL_n$ was successful), a decision step 1514 determines if there is a next word line to program. If decision step 1514 is false (there are no additional word lines to program), then the programming operation ends at step 1516. If decision step 1514 is true, then at step 1518, $WL_n$ is incrementally advanced to the next word line to be programmed, i.e., $WL_n$ is set to $WL_{n+1}$.

Step 1520 performs a programming operation which includes applying the identified BLVpgm's to corresponding bit lines and applying WLVpgm to $WL_n$. The WLVpgm which is applied at step 1520 is the WLVpgm which ultimately was successful at step 1508, and thus, WLVpgm at step 1520 may be equal to or greater than WLVpgmu.

Decision step 1522 determines if there is a next word line to program. If decision step 1522 is false (there are no additional word lines to program), then the programming operation ends at step 1516. If decision step 1522 is true, then at step 1524, $WL_n$ is incrementally advanced to the next word line to be programmed ($WL_n$ is set to $WL_{n+1}$), BLVpgm is incrementally increased (stepped up) by dBLVpgm (BLVpgm is set to BLVpgm-dBLVpgm), and WLVpgm is incrementally decreased (stepped down) by dWLVpgm (WLVpgm is set to WLVpgm-dWLVpgm). The programming operation then returns to the program operation at step 1508.

In the above example, the cumulative number of program loops (and corresponding verify loops) which must be completed to successfully program the set of word lines is reduced relative to other known programming operations which are unable to identify word line voltage based on memory cells respective word lines having positions that correspond to particular NAND string groups. In other words, the programming operation optimizes the time to acquire the optimal programming voltages. Thus, the overall performance and the endurance of the memory device are both improved.

Figure 16:
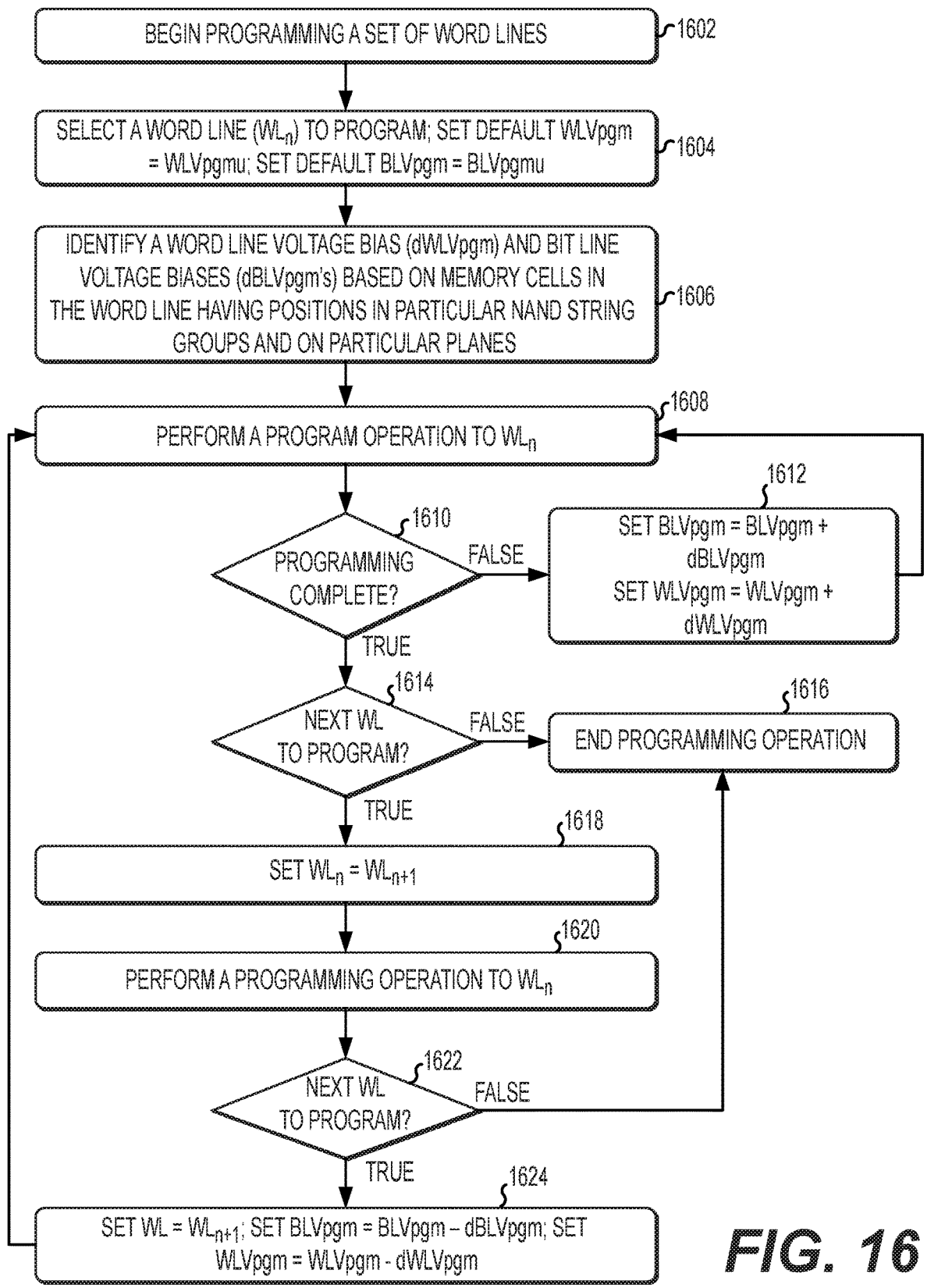
FIG. 16 is a flow diagram illustrating a method for programming a set of memory cells that correspond to NAND string groups and at least two planes by using a constant word line voltage bias and different bit line voltages for subsets of memory cells included in respective NAND string groups, according to the principles of the present disclosure.

FIG. 16 is a flowchart of an example programming operation in a memory device. Step 1602 begins a programming operation for a set of word lines or for at least one word line. Step 1604 selects a word line to program (e.g., word line [$WL_n$]) and sets a word line voltage (WLVpgm) to a predetermined initial program voltage (WLVpgmu). In one example, WLVpgmu is fourteen Volts (14 V). The selected word line may correspond to a set of bit lines.

Step 1606 identifies a word line voltage bias (dWLVpgm) and bit line voltage biases (dBLVpgm's) based on memory cells in the selected word line having positions in particular NAND string groups and on particular planes. For example, a set of available word line voltage biases and a set of available bit line biases may be identifiable for use during the programming operation. In one example, a word line voltage bias (dWLVpgm) may be identified that is a threshold number of volts higher than a default word line voltage bias. Additionally, a first bit line voltage bias (dBLVpgm 1) may be identified based on a first subset of memory cells having positions that correspond to a first NAND string group and a first plane. A second bit line voltage bias (dBLVpgm 2) may be identified based on a second subset of memory cells having positions that correspond to a second NAND string group and a second plane.

Step 1608 performs a program iteration which includes applying the BLVpgm's to the set of bit lines corresponding to the selected word line and applying WLVpgm to all of the cells coupled to $WL_n$ in a programming operation. Decision step 1610 determines if programming of the word line is done, e.g., based on the results of a verify operation. The programming may be done, for example, if all or nearly all of the cells of the word line have been programmed to their assigned data state, i.e., the data state they were assigned to represent. If decision step 1610 is false, then at step 1612, WLVpgm is incrementally increased (i.e., stepped up) by a voltage step of a default amount, i.e., WLVpgm is set to WLVpgm+dWLVpgm, and BLVpgm is incrementally decreased (i.e., stepped down) by the identified dBLVpgm. In one example, dWLVpgm is one half of a Volt (0.5 V). Next, the programming operation returns to step 1608 to conduct the next program iteration. Each repetition of step 1608 until decision step 1610 is true is one program loop, which requires resources from the controller.

If decision step 1610 is true (the program operation to $WL_n$ was successful), a decision step 1614 determines if there is a next word line to program. If decision step 1614 is false (there are no additional word lines to program), then the programming operation ends at step 1616. If decision step 1614 is true, then at step 1618, $WL_n$ is incrementally advanced to the next word line to be programmed, i.e., $WL_n$ is set to $WL_{n+1}$.

Step 1620 performs a programming operation which includes applying the identified BLVpgm's to corresponding bit lines and applying WLVpgm to $WL_n$. The WLVpgm which is applied at step 1620 is the WLVpgm which ultimately was successful at step 1608, and thus, WLVpgm at step 1620 may be equal to or greater than WLVpgmu. Decision step 1622 determines if there is a next word line to program. If decision step 1622 is false (there are no additional word lines to program), then the programming operation ends at step 1616. If decision step 1622 is true, then at step 1624, $WL_n$ is incrementally advanced to the next word line to be programmed ($WL_n$ is set to $WL_{n+1}$), BLVpgm is incrementally increased (stepped up) by dBLVpgm (BLVpgm is set to BLVpgm-dBLVpgm), and WLVpgm is incrementally decreased (stepped down) by dWLVpgm (WLVpgm is set to WLVpgm-dWLVpgm). The programming operation then returns to the program operation at step 1608.

In the above example, the cumulative number of program loops (and corresponding verify loops) which must be completed to successfully program the set of word lines is reduced relative to other known programming operations which are unable to identify word line voltage based on memory cells respective word lines having positions that correspond to particular NAND string groups. In other words, the programming operation optimizes the time to acquire the optimal programming voltages. Thus, the overall performance and the endurance of the memory device are both improved.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the two dimensional and three dimensional exemplary structures described but covers all relevant memory structures within the spirit and scope of the technology as described herein and as understood by one of skill in the art.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

Various terms are used to refer to particular system components. Different companies may refer to a component by different names—this document does not intend to distinguish between components that differ in name but not function. In the following discussion and in the claims, the terms "including" and "comprising" are used in an open-ended fashion, and thus should be interpreted to mean "including, but not limited to . . . " Also, the term "couple" or "couples" is intended to mean either an indirect or direct connection. Thus, if a first device couples to a second device, that connection may be through a direct connection or through an indirect connection via other devices and connections.

Additionally, when a layer or element is referred to as being "on" another layer or substrate, in may be directly on the other layer of substrate, or intervening layers may also be present. Further, it will be understood that when a layer is referred to as being "under" another layer, it may be directly under, and one or more intervening layers may also be present. Furthermore, when a layer is referred to as "between" two layers, it may be the only layer between the two layers, or one or more intervening layers may also be present.

As described herein, a controller includes individual circuit components, an application-specific integrated circuit (ASIC), a microcontroller with controlling software, a digital signal processor (DSP), a processor with controlling software, a field programmable gate array (FPGA), or combinations thereof.

What is claimed is:

1. A method of operating a non-volatile memory device, the method comprising:
   using control circuitry, programming a set of memory cells included in an array of memory strings that is segmented into a set of memory string groups by performing a programming operation to program the set of memory cells, wherein performing the programming operation comprises applying a set of biased word line voltages to one or more selected word lines, wherein the set of biased word line voltages have values that are based on positions of respective memory cells in the array relative to at least one outer memory string group of the set of memory string groups, wherein applying the set of biased word line voltages comprises:
      in a first programing loop, applying first biased program voltages to respective sets of memory cells in different memory string groups; and
      in a second programming loop, applying second biased program voltages to respective sets of memory cells in different memory string groups,
      wherein at least one of (i) respective amounts that amplitudes of the set of biased program voltages increase from the first biased program voltages to the second biased program voltages are different for respective ones of the different memory string groups and (ii) an amount that an amplitude of the set of biased word line voltages increases from the first bias voltage to the second bias voltage for any one of the different memory strings is different from an amount that the amplitude increases from the second bias voltage to a third bias voltage in a third programming loop.

2. The method of claim 1, wherein the values are staggered based on the positions of the respective memory cells in the array relative to the at least one outer memory string group.

3. The method of claim 2, further comprising applying a first biased word line voltage to a first set of memory cells of an inner-most string group, applying a second biased word line voltage to a second set of memory cells of one or more other inner string groups, and applying a third biased word line voltage to a third set of memory cells of an outer-most string group, wherein each voltage is staggered such that the first biased word line voltage has a highest voltage value and the third biased word line voltage has a lowest voltage value.

4. The method of claim 1, further comprising, while performing the programming operation:
   applying a first word line voltage bias to a first word line, of the one or more selected word lines, based on the first word line connecting with a first subset of memory cells that are positioned in an outer memory string group of the set of memory string groups, and
   applying a second word line voltage bias to a second word line, of the one or more selected word lines, based on the second word line connecting with a second subset of memory cells that are positioned in an inner memory string group of the set of memory string groups.

5. The method of claim 4, wherein the second word line voltage bias associated with the inner string group is greater than the first word line voltage bias associated with the outer memory string group.

6. The method of claim 4, wherein the inner memory string group is an inner-most memory string group of at least three inner memory string groups, the method further comprising, while performing the programming operation:
   applying a third word line voltage bias to a third word line, of the one or more selected word lines, based on the third word line connecting with a third subset of memory cells that are positioned in another inner memory string group of the at least three inner memory string groups, the third word line voltage bias being greater than the first word line voltage bias and less than the second word line voltage bias.

7. The method of claim 1, further comprising, while performing the programming operation:
   applying a first word line voltage bias to a first word line, of the one or more selected word lines, based on the first word line connecting with a first subset of memory cells that are positioned in an inner-most memory string group that is part of at least three adjacent inner memory string groups of the set of memory string groups, and
   applying a second word line voltage bias to a second word line, of the one or more selected word lines, based on the second word line connecting with a second subset of memory cells that are positioned in another inner memory string group of the at least three adjacent inner memory string groups,
   wherein the first word line voltage bias associated with the inner-most memory string group is greater than the second word line voltage bias associated with the other inner memory string group.

8. The method of claim 1, wherein contact line connectors used to segment the array into the set of memory string groups include a first set of contact line connectors that have a first thickness and a second set of contact line connectors that have a second thickness that is different than the first thickness.

* * * * *